United States Patent
Takahashi

(10) Patent No.: US 8,981,343 B2
(45) Date of Patent: Mar. 17, 2015

(54) SEMICONDUCTOR DEVICE AND RECEIVER

(71) Applicant: Fujitsu Limited, Kawasaki-shi (JP)

(72) Inventor: Tsuyoshi Takahashi, Ebina (JP)

(73) Assignee: Fujitsu Limited, Kawasaki (JP)

( * ) Notice: Subject to any disclaimer, the term of this patent is extended or adjusted under 35 U.S.C. 154(b) by 40 days.

(21) Appl. No.: 13/743,031

(22) Filed: Jan. 16, 2013

(65) Prior Publication Data

US 2013/0240835 A1    Sep. 19, 2013

(30) Foreign Application Priority Data

Mar. 13, 2012 (JP) ................................. 2012-056232

(51) Int. Cl.
| | |
|---|---|
| H01L 29/06 | (2006.01) |
| H01L 31/0352 | (2006.01) |
| H01L 31/109 | (2006.01) |
| B82Y 20/00 | (2011.01) |

(52) U.S. Cl.
CPC ...... H01L 31/035236 (2013.01); H01L 31/109 (2013.01); B82Y 20/00 (2013.01)
USPC .......... 257/14; 257/15; 257/98; 257/E33.008; 257/E31.033

(58) Field of Classification Search
USPC ................. 257/15, 98, 14, E33.008, E31.033
See application file for complete search history.

(56) References Cited

U.S. PATENT DOCUMENTS

| | | | | |
|---|---|---|---|---|
| 5,361,408 | A | * | 11/1994 | Watanabe et al. .............. 455/324 |
| 8,265,582 | B2 |   | 9/2012  | Takahashi |
| 8,306,495 | B1 |   | 11/2012 | Takahashi |
| 2010/0248676 | A1 | * | 9/2010 | Takahashi ...................... 455/341 |
| 2012/0235116 | A1 | * | 9/2012 | Su et al. .......................... 257/13 |

FOREIGN PATENT DOCUMENTS

| | | |
|---|---|---|
| JP | 63-46788 | 2/1988 |
| JP | 05-275809 | 10/1993 |
| JP | 2010-251689 | 11/2010 |

* cited by examiner

*Primary Examiner* — Tan N Tran
(74) *Attorney, Agent, or Firm* — Fujitsu Patent Center

(57) ABSTRACT

A semiconductor device includes a p-type semiconductor layer, an n-type semiconductor layer, a pn junction portion at which the p-type semiconductor layer and the n-type semiconductor layer are joined to each other, and a multiple quantum barrier structure or a multiple quantum well structure that is provided in at least one of the p-type semiconductor layer and the n-type semiconductor layer and functions as a barrier against at least one of electrons and holes upon biasing in a forward direction. Upon biasing in a reverse direction, a portion that allows band-to-band tunneling of electrons is formed at the pn junction portion.

20 Claims, 40 Drawing Sheets

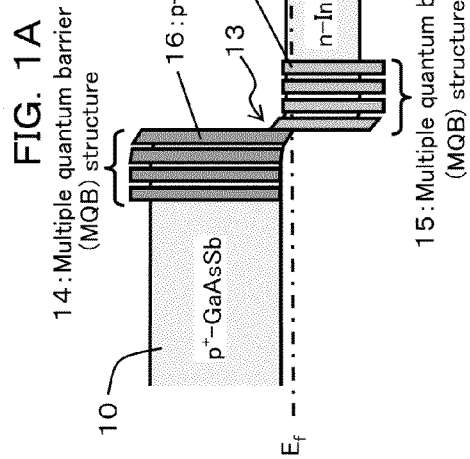
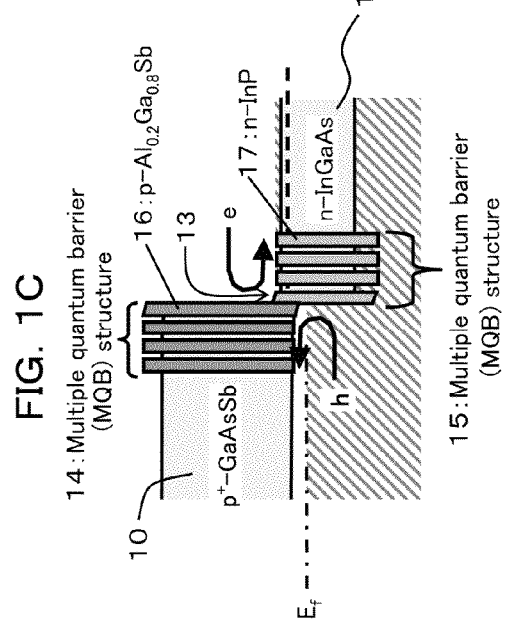
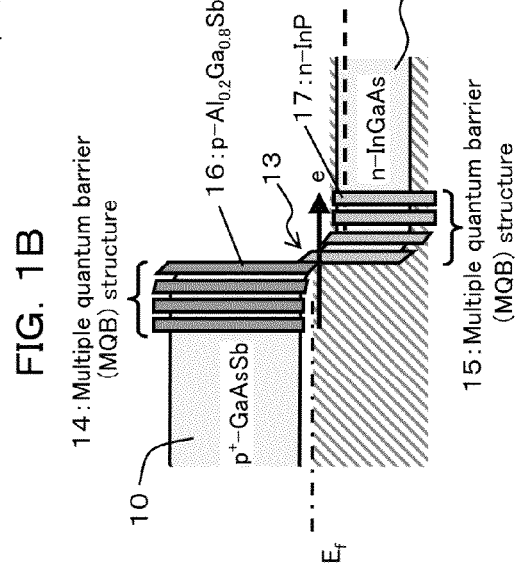

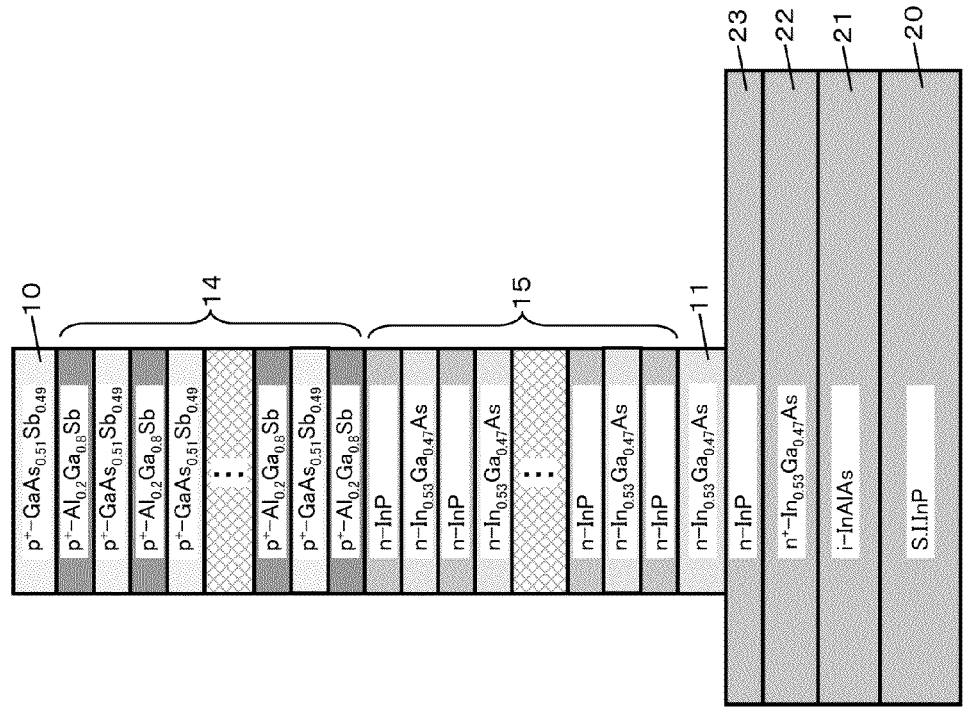
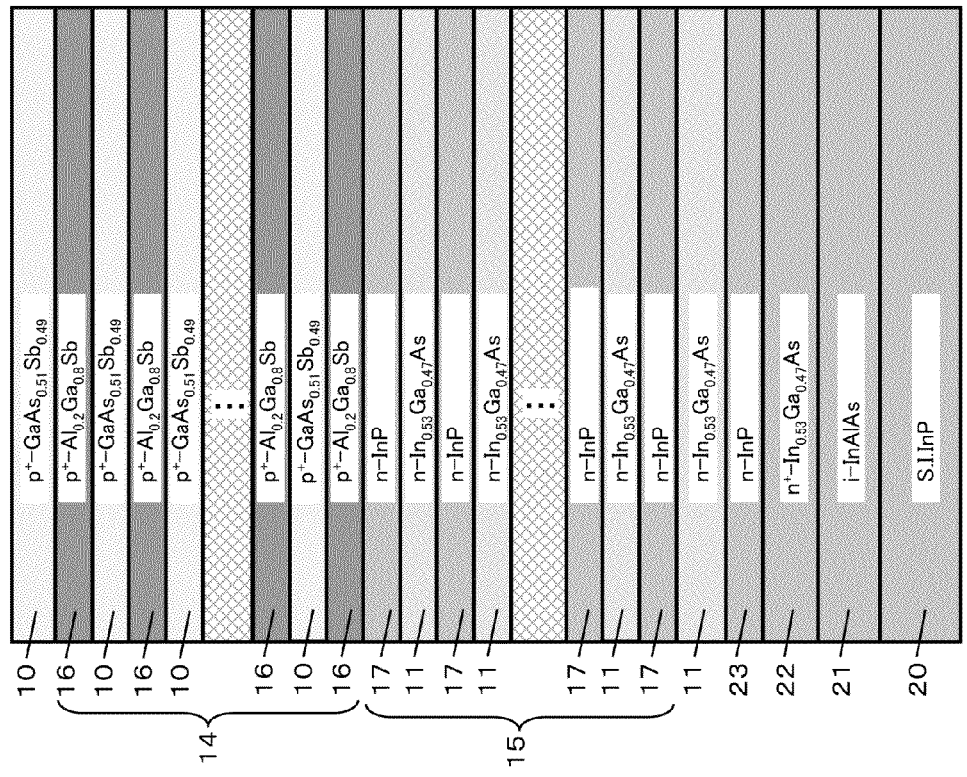

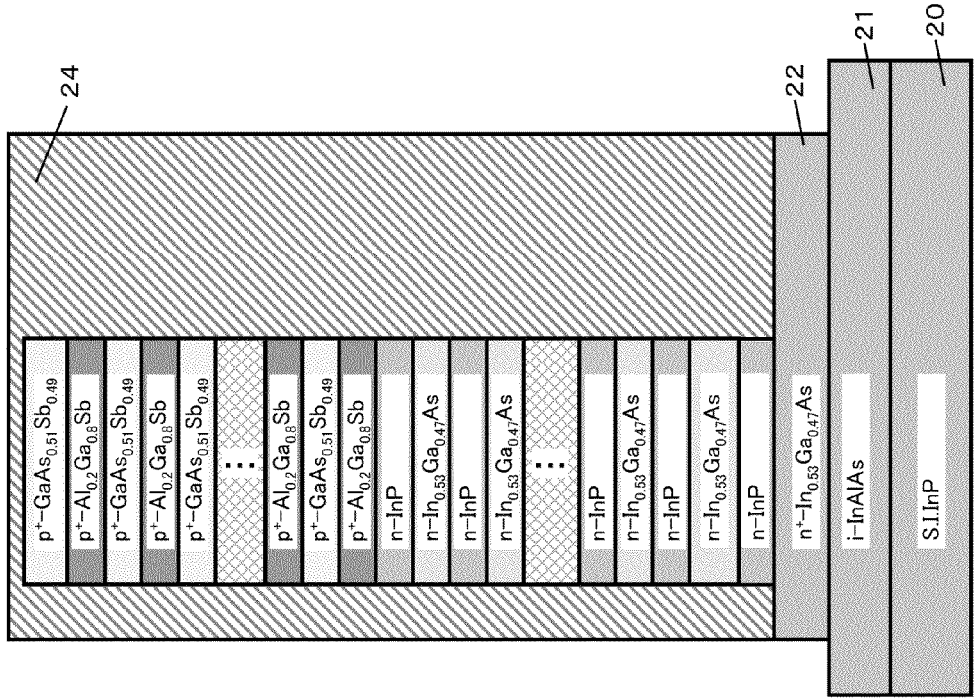
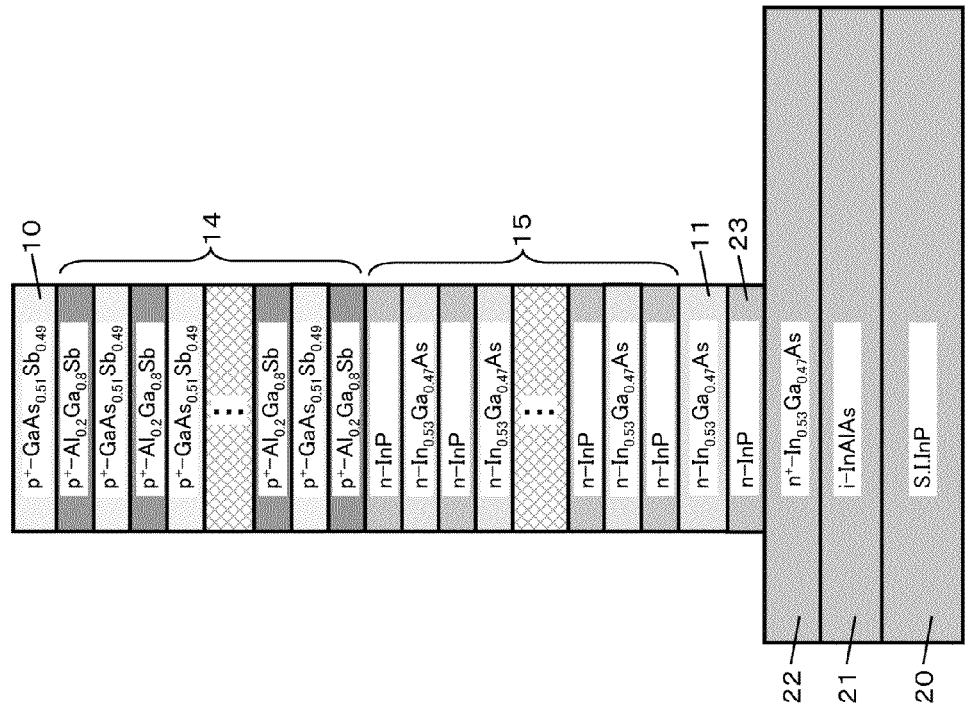

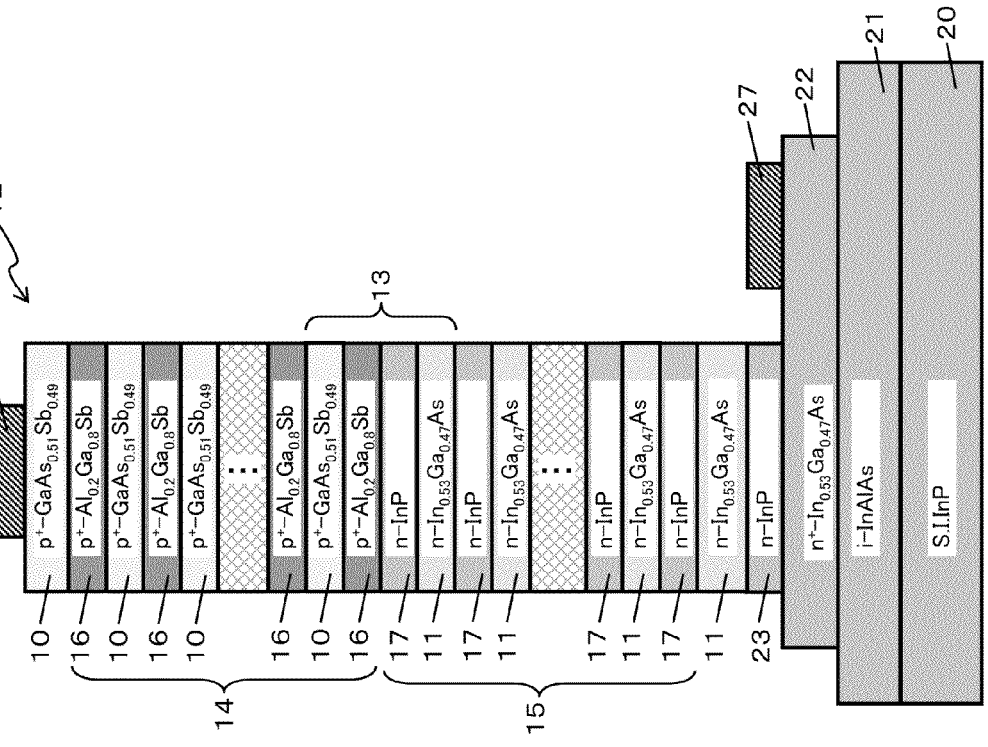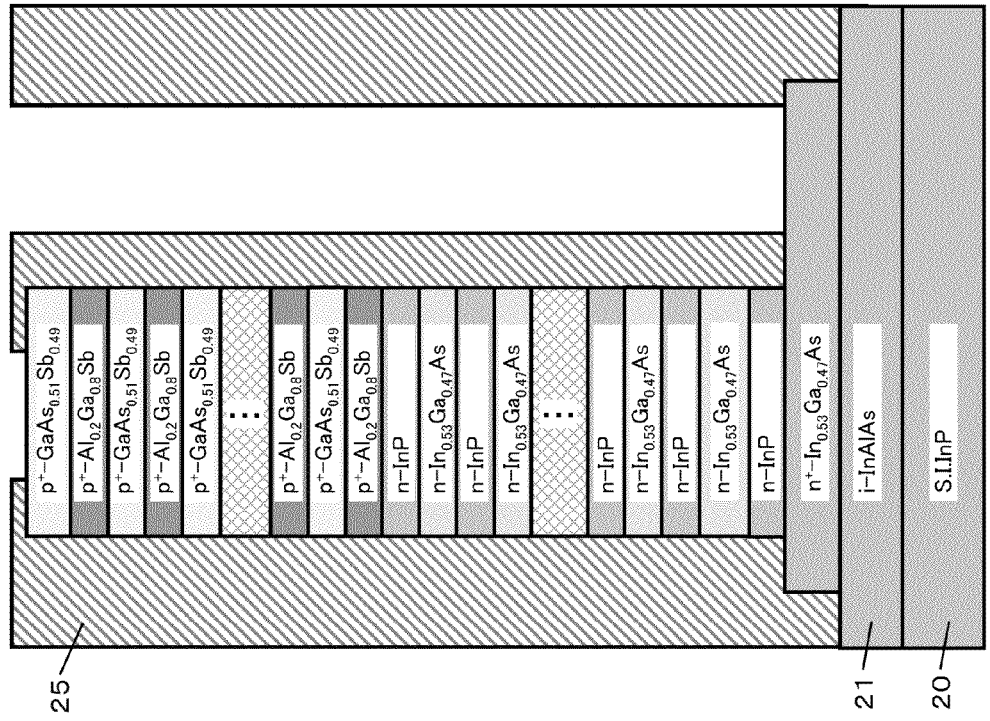

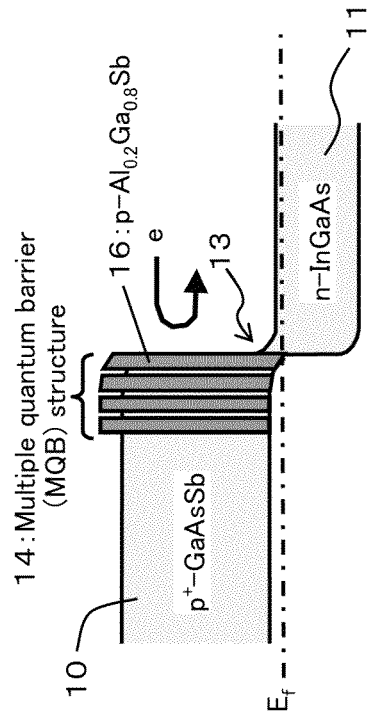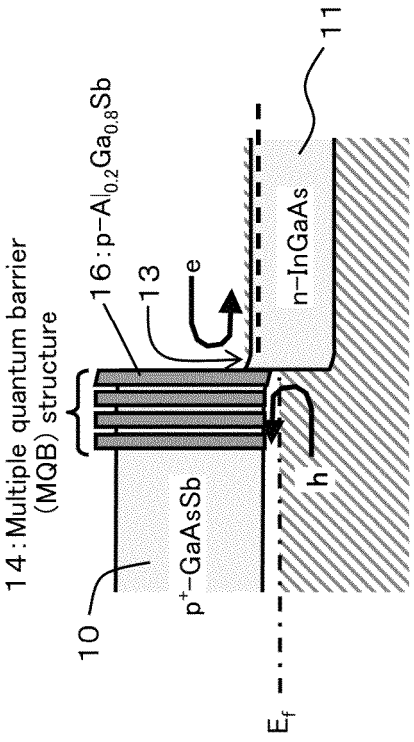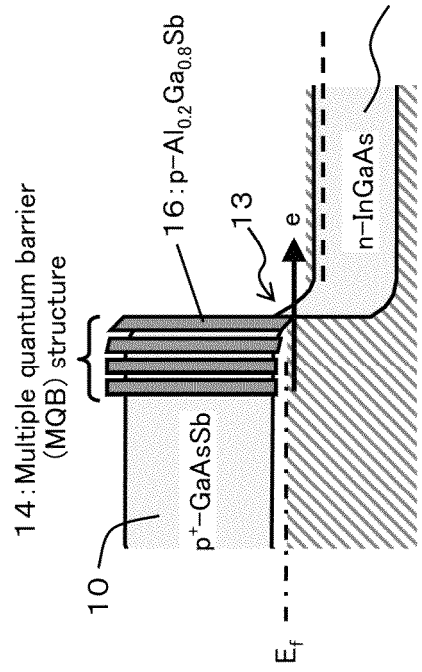

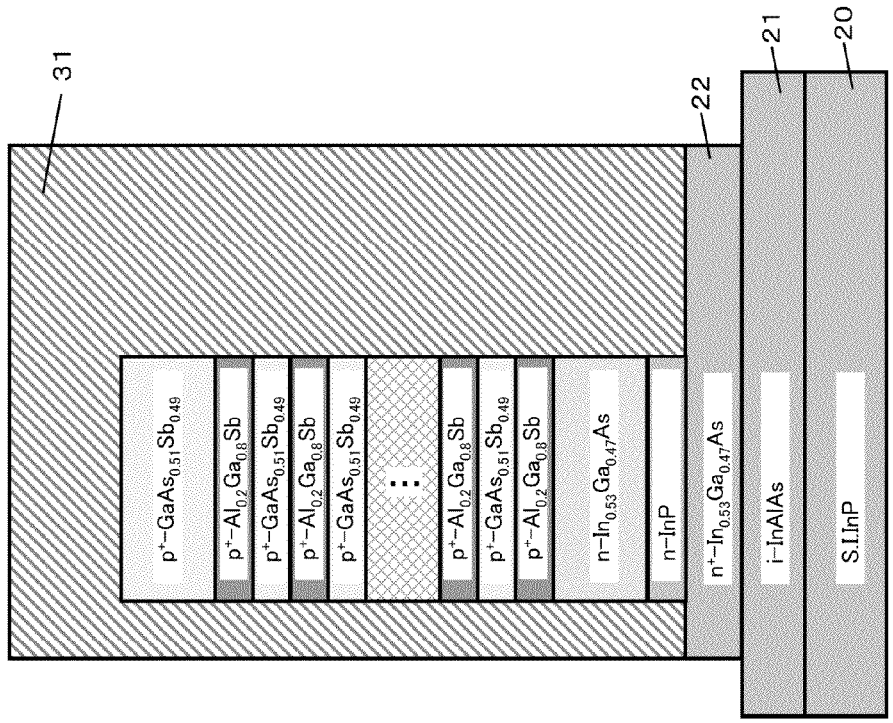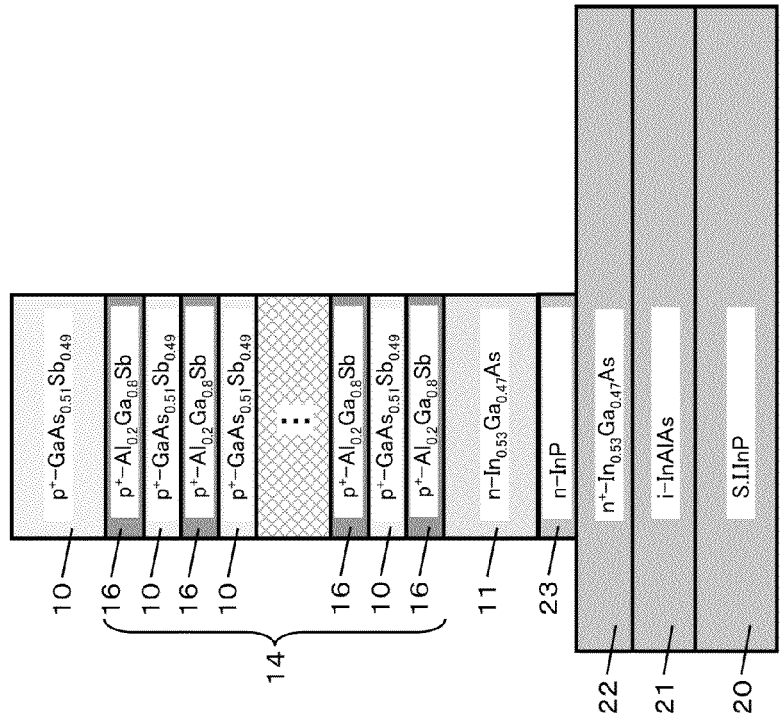

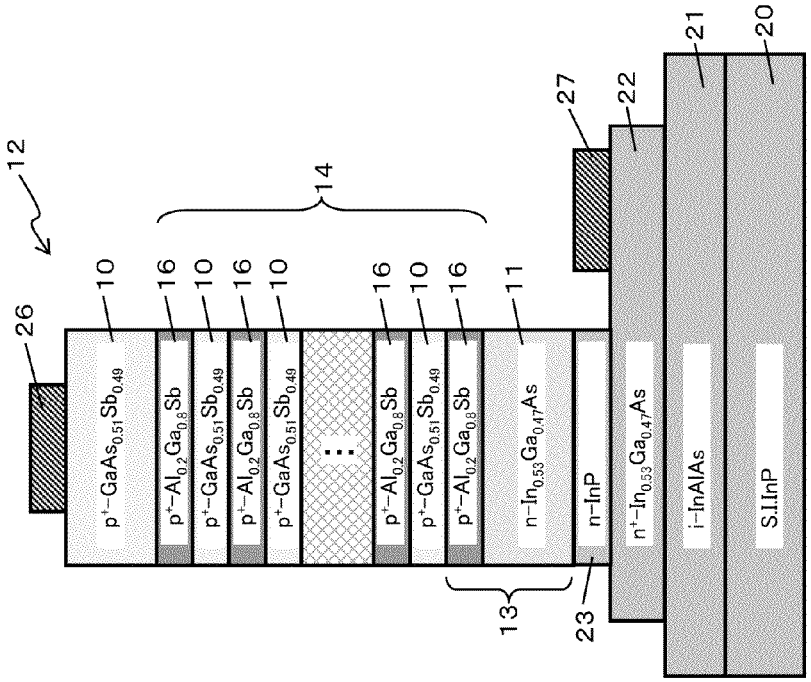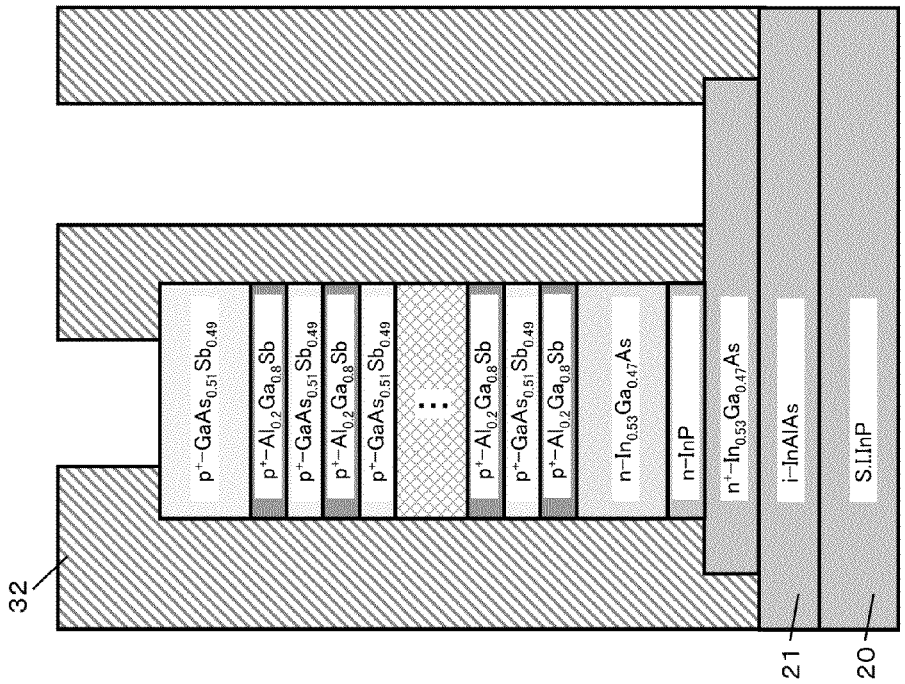

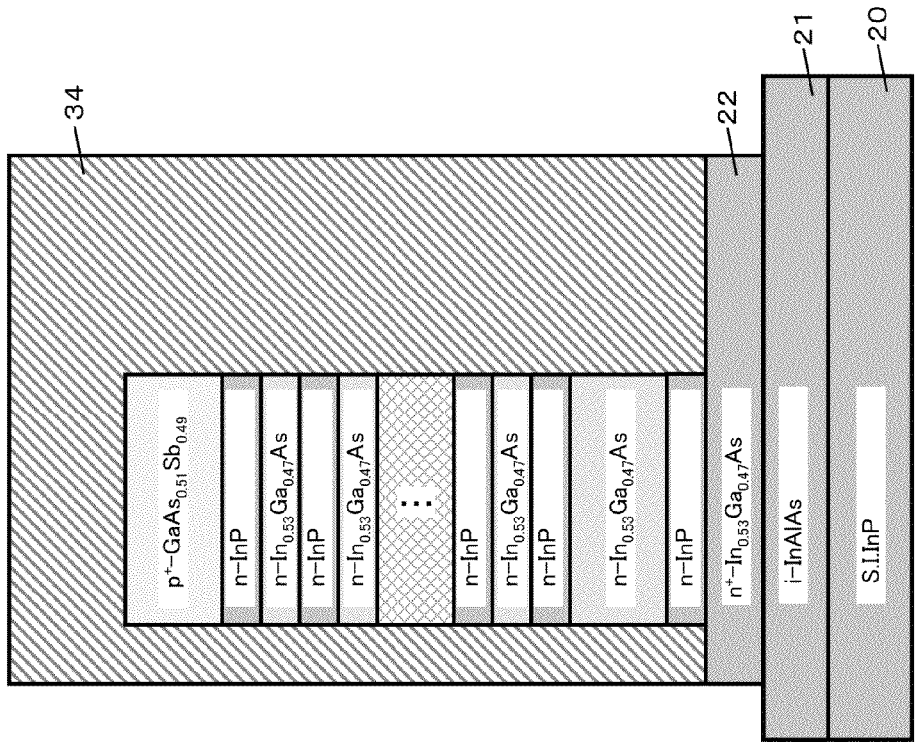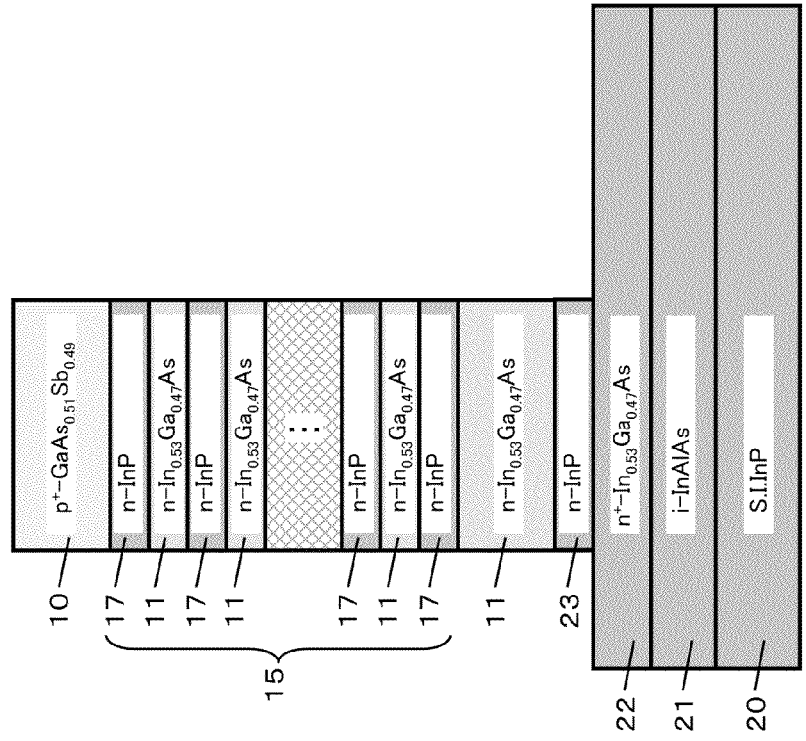

42: p-GaSb
10: p-GaAsSb
43: n-In$_{0.6}$Ga$_{0.4}$As
11: n-In$_{0.53}$Ga$_{0.47}$As

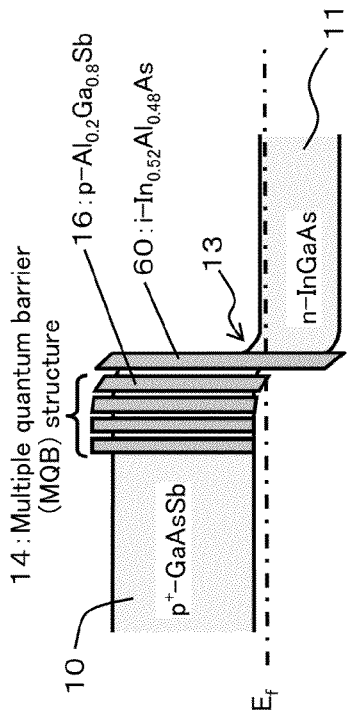
FIG. 34A
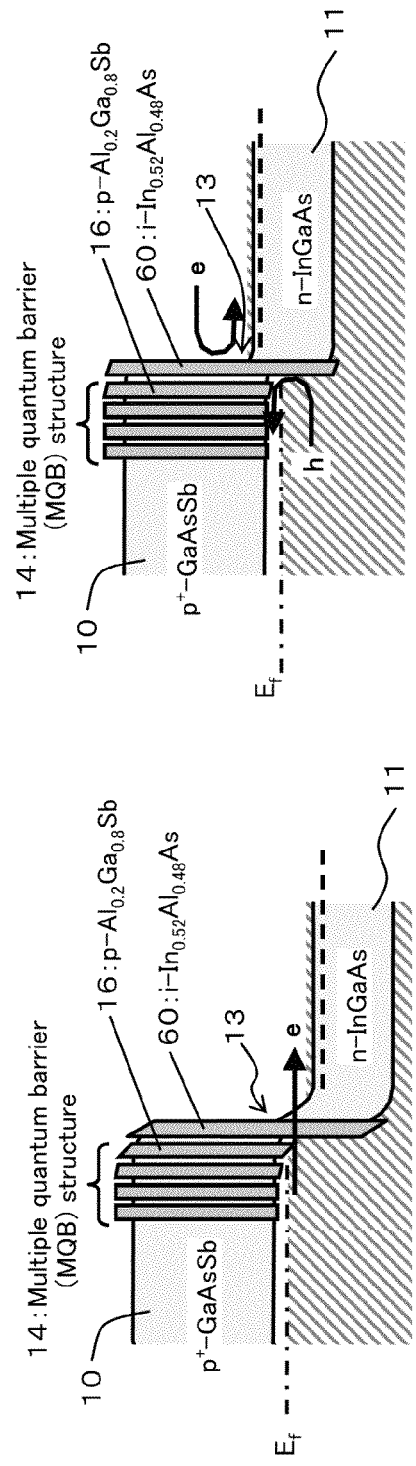
FIG. 34C
FIG. 34B

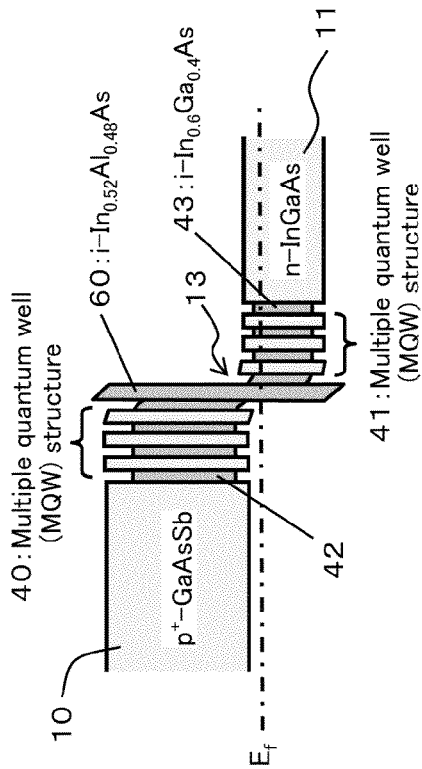
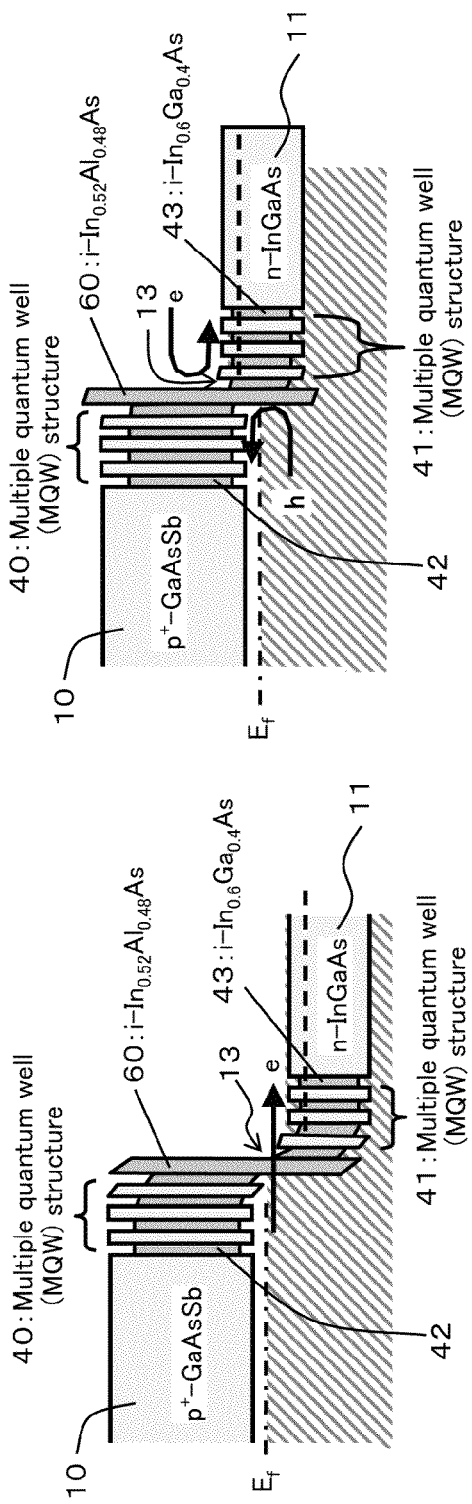
FIG. 36A
FIG. 36B
FIG. 36C

US 8,981,343 B2

SEMICONDUCTOR DEVICE AND RECEIVER

CROSS-REFERENCE TO RELATED APPLICATION

This application is based upon and claims the benefit of priority of the prior Japanese Patent Application No. 2012-056232, filed on Mar. 13, 2012, the entire contents of which are incorporated herein by reference.

FIELD

The embodiments discussed herein are related to a semiconductor device and a receiver.

BACKGROUND

For example, in a receiver that receives a weak radio wave of a millimeter wave band, a terahertz wave band or a like wave band, a low noise amplifier, a detector and so forth are required. A Schottky diode is used for the detector.

However, where the Schottky diode is used, it is difficult to obtain a sufficient detection characteristic in the proximity of a bias of 0 V.

Therefore, the inventor of the present invention has proposed to use a backward diode wherein a p-type GaAsSb layer and an n-type InGaAs layer are pn-joined in place of the Schottky diode in order to improve the detection characteristic.

It is to be noted that a technique is available wherein, in order to efficiently confine injection carriers in an active layer so that electrons and holes are re-coupled in a semiconductor light emitting device such as a semiconductor laser, a multiple superlattice structure is provided to increase the height of an energy barrier against electrons or holes. Further, a technique is available wherein, in a semiconductor light emitting device such as a semiconductor laser, a multiple quantum well structure portion or a multiple quantum barrier structure portion for controlling the advancement of minority carriers into a cladding layer is provided between the cladding layer and an active layer.

SUMMARY

According to an aspect of the embodiment, a semiconductor device includes a p-type semiconductor layer, an n-type semiconductor layer, a pn junction portion at which the p-type semiconductor layer and the n-type semiconductor layer are joined to each other, and a multiple quantum barrier structure or a multiple quantum well structure that is provided in at least one of the p-type semiconductor layer and the n-type semiconductor layer and functions as a barrier against at least one of electrons and holes upon biasing in a forward direction, wherein, upon biasing in a reverse direction, a portion that allows band-to-band tunneling of electrons is formed at the pn junction portion.

According to another aspect of the embodiment, a receiver includes an amplifier, and a detector connected to the amplifier, wherein the detector is the semiconductor device described above.

According to a further aspect of the embodiment, a receiver includes a mixer circuit, wherein the mixer circuit includes the semiconductor device described above.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 1A to 1C are schematic views illustrating an energy band structure of a semiconductor device (backward diode) of a first embodiment, wherein FIG. 1A illustrates a balanced state in which a voltage is not applied, FIG. 1B illustrates a reverse bias state in which a voltage is applied in the reverse direction and FIG. 1C illustrates a forward bias state in which a voltage is applied in the forward direction;

FIGS. 8A and 8B are schematic views illustrating an effect where doping is carried out for barrier layers that configure the MQB structure provided in the semiconductor device (backward diode) of the first embodiment, wherein FIG. 8A illustrates an energy band structure where doping is not carried out for the barrier layers and FIG. 8B illustrates an energy band structure where doping is carried out for the barrier layers;

FIGS. 10A and 10B are schematic sectional views illustrating a fabrication method for the semiconductor device (backward diode) of the first embodiment;

FIGS. 11A and 11B are schematic sectional views illustrating the fabrication method for the semiconductor device (backward diode) of the first embodiment;

FIGS. 12A and 12B are schematic sectional views illustrating the fabrication method for and a configuration of the semiconductor device (backward diode) of the first embodiment;

FIGS. 14A to 14C are schematic views illustrating an energy band structure of the semiconductor device (backward diode) of the modification to the first embodiment, wherein FIG. 14A illustrates a balanced state in which a voltage is not applied, FIG. 14B illustrates a reverse bias state in which a voltage is applied in the reverse direction and FIG. 14C illustrates a forward bias state in which a voltage is applied in the forward direction;

FIGS. 16A and 16B are schematic sectional views illustrating the fabrication method for the semiconductor device (backward diode) of the modification to the first embodiment;

FIGS. 17A and 17B are schematic sectional views illustrating the fabrication method for and a configuration of the semiconductor device (backward diode) of the modification to the first embodiment;

FIGS. 18A to 18C are schematic views illustrating an energy band structure of a semiconductor device (backward diode) of another modification to the first embodiment, wherein FIG. 18A illustrates a balanced state in which a voltage is not applied, FIG. 18B illustrates a reverse bias state in which a voltage is applied in the reverse direction and FIG. 18C illustrates a forward bias state in which a voltage is applied in the forward direction;

FIGS. 20A and 20B are schematic sectional views illustrating the fabrication method for the semiconductor device (backward diode) of another modification to the first embodiment;

FIGS. 33A to 33C are schematic views illustrating an energy band structure of the semiconductor device (backward diode) of the second embodiment, wherein FIG. 33A illustrates a balanced state in which a voltage is not applied, FIG. 33B illustrates a reverse bias state in which a voltage is applied in the reverse direction and FIG. 33C illustrates a forward bias state in which a voltage is applied in the forward direction;

FIGS. 34A to 34C are schematic views illustrating an energy band structure of a semiconductor device (backward diode) of a modification to the second embodiment, wherein FIG. 34A illustrates a balanced state in which a voltage is not applied, FIG. 34B illustrates a reverse bias state in which a voltage is applied in the reverse direction and FIG. 34C illustrates a forward bias state in which a voltage is applied in the forward direction;

FIGS. 35A to 35C are schematic views illustrating an energy band structure of a semiconductor device (backward diode) of another modification to the second embodiment, wherein FIG. 35A illustrates a balanced state in which a voltage is not applied, FIG. 35B illustrates a reverse bias state in which a voltage is applied in the reverse direction and FIG. 35C illustrates a forward bias state in which a voltage is applied in the forward direction;

FIGS. 36A to 36C are schematic views illustrating an energy band structure of a semiconductor device (backward diode) of a further modification to the second embodiment, wherein FIG. 36A illustrates a balanced state in which a voltage is not applied, FIG. 36B illustrates a reverse bias state in which a voltage is applied in the reverse direction and FIG. 36C illustrates a forward bias state in which a voltage is applied in the forward direction;

FIGS. 37A to 37C are schematic views illustrating an energy band structure of a semiconductor device (backward diode) of a still further modification to the second embodiment, wherein FIG. 37A illustrates a balanced state in which a voltage is not applied, FIG. 37B illustrates a reverse bias state in which a voltage is applied in the reverse direction and FIG. 37C illustrates a forward bias state in which a voltage is applied in the forward direction;

FIGS. 38A to 38C are schematic views illustrating an energy band structure of a semiconductor device (backward diode) of a yet further modification to the second embodiment, wherein FIG. 38A illustrates a balanced state in which a voltage is not applied, FIG. 38B illustrates a reverse bias state in which a voltage is applied in the reverse direction and FIG. 38C illustrates a forward bias state in which a voltage is applied in the forward direction;

FIGS. 40A to 40C are schematic views illustrating a subject of a conventional backward diode, wherein FIG. 40A illustrates an energy band structure, FIG. 40B illustrates an I-V characteristic and FIG. 40C is a view illustrating a characteristic where current is logarithm-plotted.

DESCRIPTION OF EMBODIMENTS

Figure 40A:
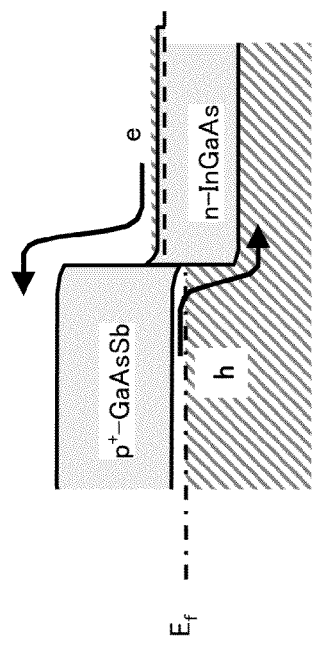

However, in the backward diode described above, since the barrier against electrons and holes is low upon biasing in a forward direction as illustrated in FIG. 40A, leakage current flows.

Figure 40C:
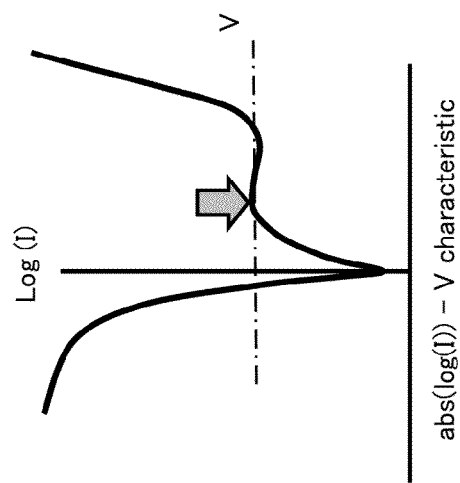
Figure 40B:
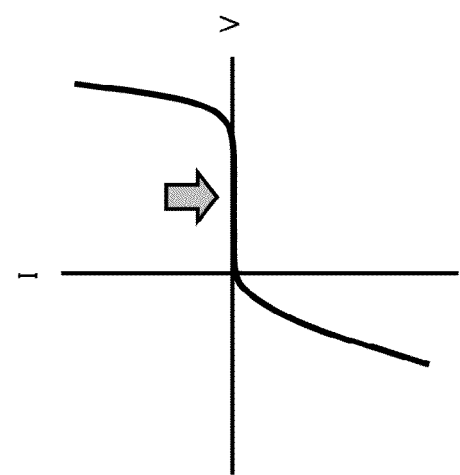

Here, in the current-voltage characteristic (I-V characteristic) where current is linear-plotted, it looks at a glance that leakage current does not flow upon biasing in the forward direction as indicated by an arrow mark in FIG. 40B. However, if current is logarithm-plotted, then a leakage component of current is noticed as indicated by an arrow mark in FIG. 40C. Consequently, the value of γ (curvature coefficient) that has an influence on a detection characteristic of a diode is less likely to become high. It is to be noted that the curvature coefficient γ is defined by the following expression (1):

$$\gamma = d^2I/dv^2/dI/dv \quad (1)$$

Therefore, if it is tried to detect a weak radio wave, for example, of a millimeter wave band or a terahertz wave band using the backward diode described above as a detector, then a satisfactory detection characteristic is not obtained.

It is to be noted that, while the subject is described taking the backward diode wherein a p-type GaAsSb layer and an n-type InGaAs layer are pn-joined as an example, the subject is not limited to this, and also other backward diodes have a similar subject.

Therefore, it is desired to suppress leakage current upon biasing in the forward direction of the backward diode. Further, it is desired to improve the detection characteristic of a detector for which the backward diode is used and hence improve a characteristic of a receiver.

In the following, a semiconductor device and a receiver according to embodiments are described with reference to the drawings.

First Embodiment

First, a semiconductor device and a receiver according to a first embodiment are described with reference to FIGS. 1A to 13.

Figure 2:
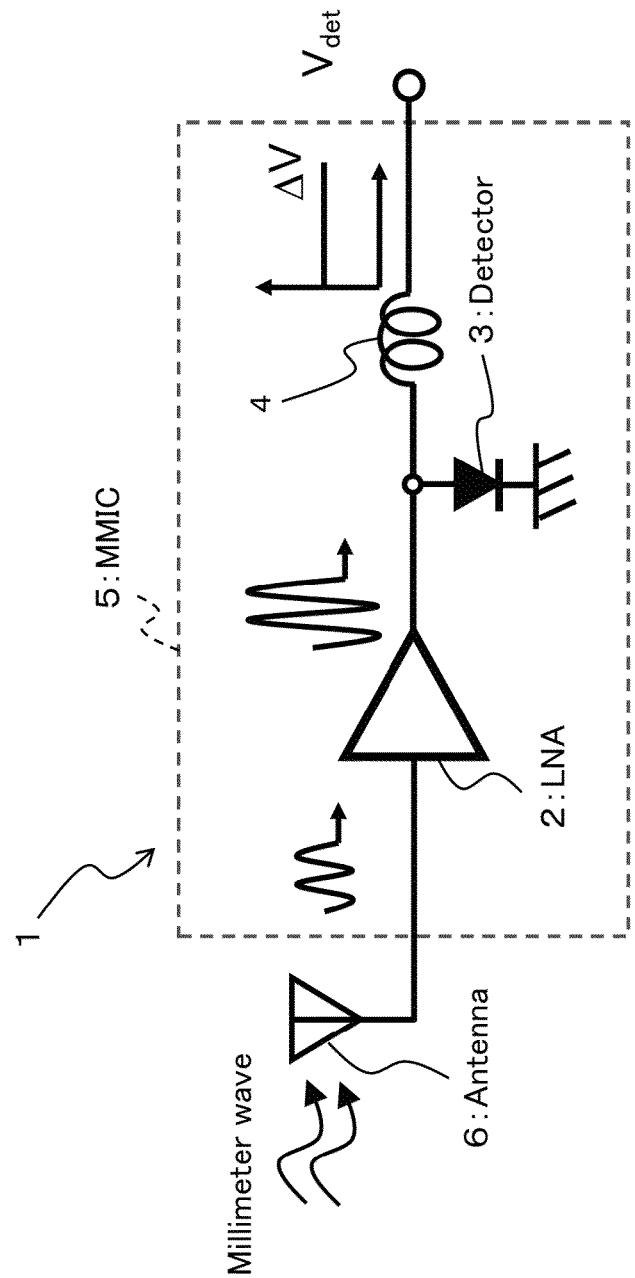
FIG. 2 is a schematic view illustrating a configuration of a receiver of the first embodiment.

As depicted in FIG. 2, the receiver according to the present embodiment is a receiver 1 that receives a weak radio wave, for example, of a millimeter wave band or a terahertz wave band and includes a monolithic microwave integrated circuit (MMIC) 5 in which a low noise amplifier (LNA) 2, a detector 3 and an inductor 4 are integrated. It is to be noted that the low noise amplifier 2 is sometimes referred to also as amplifier.

Here, for example, a high electron mobility transistor (HEMT) is used for the low noise amplifier 2 and a backward diode hereinafter described is used for the detector 3. The HEMT and the backward diode connected to the HEMT are configured as a semiconductor device formed from a compound semiconductor (here, a GaAsSb-based semiconductor) on a semiconductor substrate. In particular, the semiconductor device according to the present embodiment includes a backward diode used as the detector 3 in the receiver 1 that receives a weak radio wave (high-frequency signal), for example, of a millimeter wave band or a terahertz wave band. It is to be noted that the detector is hereinafter referred to sometime as high-sensitivity detector.

Further, an antenna 6 is connected to an input terminal of the MMIC 5, namely, to an input terminal of the low noise amplifier 2. Here, the antenna 6 is connected to the gate electrode of the HEMT. Further, an output terminal of the low noise amplifier 2, namely, the drain electrode of the HEMT, is connected to one of terminals of the detector 3, namely, to one of electrodes (to the n-side electrode) of the backward diode and one of terminals of the inductor 4. Further, the other one of the terminals of the detector 3, namely, the other one of the electrodes (the p-side electrode) of the backward diode, is grounded. Further, the other one of the terminals of the inductor 4 is connected to an output terminal of the MMIC 5. A weak radio wave of a millimeter wave band or a like band received by the antenna 6 is amplified by the low noise amplifier 2 and then converted into a detection signal $V_{det}$ that is a DC voltage by the detector 3 and the inductor 4. The detection signal $V_{det}$ is outputted from the output terminal of the MMIC 5. As the detection signal $V_{det}$, a potential difference ΔV of several hundred mV is outputted. The detection sensitivity (detection characteristic) of the backward diode has an influence on the detection performance.

Incidentally, as depicted in FIG. 12B, the semiconductor device according to the present embodiment includes a backward diode 12 wherein a p-type GaAsSb layer (p-type semiconductor) 10 and an n-type InGaAs layer (n-type semiconductor) 11 are pn-joined. In particular, the semiconductor device includes a pn junction portion 13 at which the p-type GaAsSb layer 10 and the n-type InGaAs layer 11 are joined to each other.

In particular, the p-type GaAsSb layer 10 that configures the backward diode 12 is configured from a $p^+$-GaAs$_{0.51}$Sb$_{0.49}$ layer having a band gap Eg of approximately 0.78 eV and a doping concentration of $2\times10^{19}$ cm$^{-3}$. It is to be noted that the p-type semiconductor layer is not limited to this, and a p-InGaAsSb layer (Eg<0.78 eV) that has a band gap Eg smaller than that of the layer just described or a like layer may be used. Or conversely, a GaAs$_x$Sb$_{1-x}$ (x>0.51) layer (Eg>0.78 eV) that has a band gap Eg greater than that of the layer described above or a like layer may be used.

Further, the n-type InGaAs layer 11 that configures the backward diode 12 is configured from an n-In$_{0.53}$Ga$_{0.47}$As layer that has a band gap Eg of approximately 0.74 eV and a doping concentration of $5\times10^{15}$ cm$^{-3}$. It is to be noted that the n-type semiconductor layer is not limited to this, and an n-In$_x$Ga$_{1-x}$As (x>0.53) layer (Eg<0.74 eV) that has a band gap Eg smaller than that of the layer just described, an n-InAlGaAs layer (Eg>0.74 eV) that has a band gap Eg greater than that of the layer described above or a like layer may be used.

Figure 5:
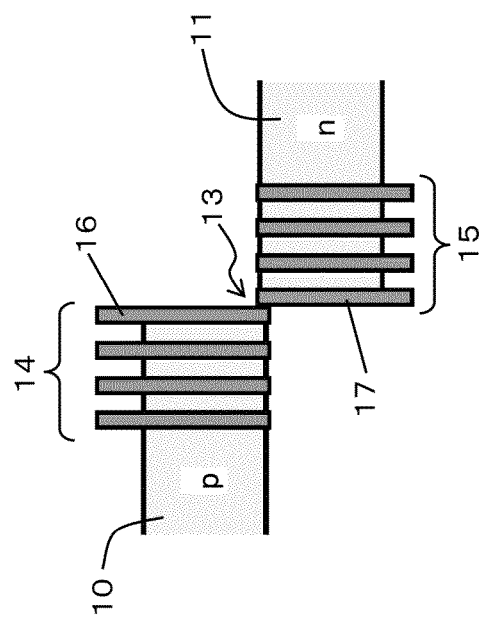
FIG. 5 is a schematic view illustrating an energy band structure in a flat band state in the semiconductor device (backward diode) of the first embodiment.

While the backward diode 12 in the present embodiment is a pn-junction diode wherein the p-type semiconductor layer 10 and the n-type semiconductor layer 11 whose materials are different from each other are hetero-joined (hereto-junction), there is a condition for the band junction. In particular, as depicted in FIG. 5, the diode has a hetero junction of the type II wherein, in a flat band state, the energy at a lower end of the conduction band of the n-type semiconductor layer 11 is lower than that at a lower end of the conduction band of the p-type semiconductor layer 10 and the energy at an upper end of the valence band of the n-type semiconductor layer 11 is lower than that at an upper end of the valence band of the p-type semiconductor layer 10, and besides the energy at the lower end of the conduction band of the n-type semiconductor layer 11 is higher than that at the upper end of the valence band of the p-type semiconductor layer 10. By using such a backward diode 12 as described above for the detector 3, the detection sensitivity of a weak radio wave, for example, of a millimeter wave band or a like band can be improved significantly in comparison with that in an alternative case in which a Schottky diode is used for the detector 3. It is to be noted that the flat band state signifies a state in which a voltage is applied so that a curved portion of the energy band becomes flat, and is referred to also as flat band condition.

Particularly, in the present embodiment, as depicted in FIGS. 5 and 1A to 1C, multiple quantum barrier (MQB; Multi Quantum Barrier) structures 14 and 15 are provided in both of the p-type GaAsSb layer 10 and the n-type InGaAs layer 11 of such a backward diode 12 as described above, respectively, so that re-coupling of electrons and holes may be prevented. In particular, as MQB structures, the p-side MQB structure 14 disposed in the p-type GaAsSb layer 10 and the n-side MQB structure 15 disposed in the n-type InGaAs layer 11 are provided. It is to be noted that, in FIGS. 1A to 1C, reference character Ef indicates a Fermi level.

Consequently, as depicted in FIG. 1C, upon biasing in the forward direction, electrons are reflected by the p-side MQB structure 14 provided in the p-type GaAsSb layer 10 and holes are reflected by the n-side MQB structure 15 provided in the n-type InGaAs layer 11 so that leakage current is suppressed. In particular, upon biasing in the forward direction, the p-side MQB structure 14 provided in the p-type GaAsSb layer 10 functions as a barrier (energy barrier) against electrons of the conduction band and the n-side MQB structure 15 provided in the n-type InGaAs layer 11 functions as a barrier (energy barrier) against holes of the valence band so that leakage current upon biasing in the forward direction is suppressed.

Particularly, since the MQB structures 14 and 15 in the present embodiment are provided in both of the p-type GaAsSb layer 10 and the n-type InGaAs layer 11, respectively, a current suppression effect upon biasing in the forward direction is higher than that where the MQB structure 14 (15) is provided in one of the p-type GaAsSb layer 10 and the n-type InGaAs layer 11 as in a modification hereinafter described.

Since the leakage current upon biasing in the forward direction is suppressed in such a manner as described above, the value of $\gamma$ that indicates a nonlinearity of the diode increases, and, for example, where the semiconductor device in the present embodiment is used for a detector for detecting a weak radio wave, for example, of a millimeter wave band or a terahertz wave band, the detection performance in zero biasing is particularly enhanced and a satisfactory detection characteristic can be obtained.

Here, the principle of the MQB structure is described with reference to FIGS. 3, 4A and 4B.

Figure 3:
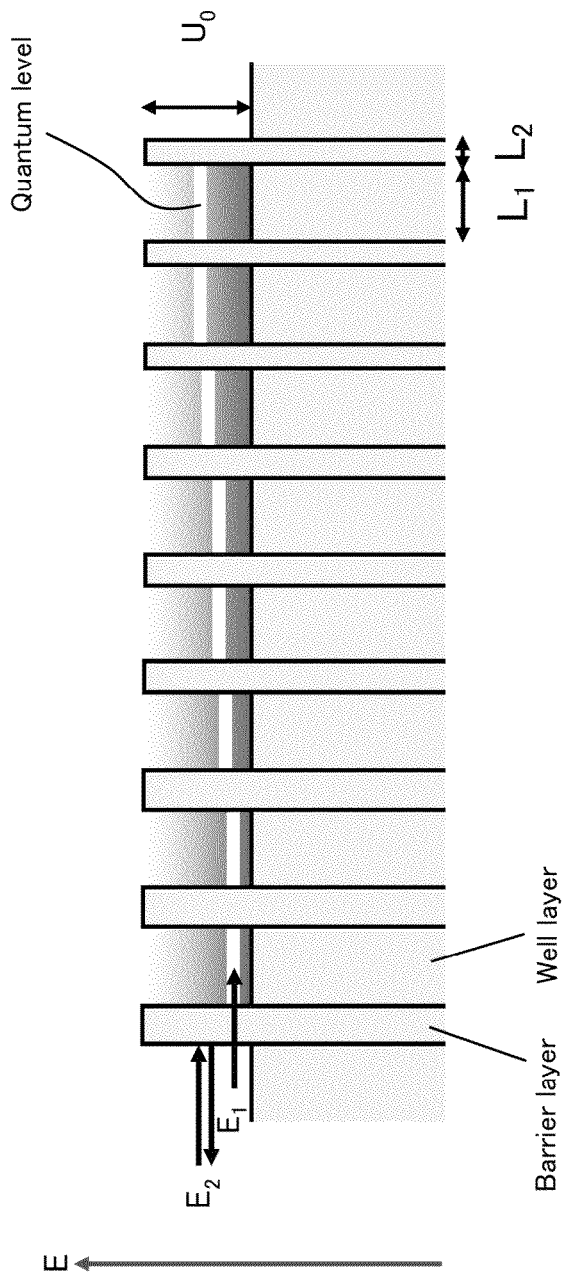
FIG. 3 is a schematic view illustrating a principle of an MQB structure provided in the semiconductor device (backward diode) of the first embodiment.
Figure 4A:
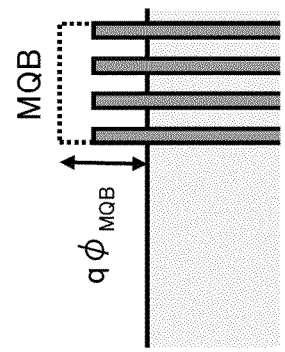
FIGS. 4A and 4B are schematic views illustrating a principle and a working effect of the MQB structure provided in the semiconductor device (backward diode) of the first embodiment.
Figure 4B:
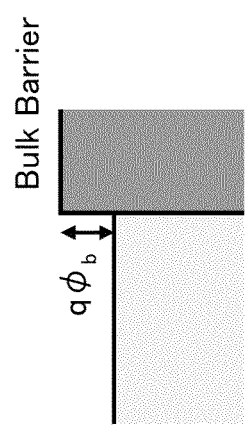

As depicted in FIG. 3, a multilayer structure is configured by alternately stacking a barrier layer that has the thickness with which a carrier can tunnel and a well layer. At this time, if also the well layer is formed thin, then the existence probability of carriers is quantized and a quantum level is formed. Then, the thickness of the barrier layers of the MQB structure is made different thereamong so as to gradually change thereby to gradually change the level of the quantum level. Consequently, an MQB structure is produced through which, as viewed generally, carries can not pass and by which even carriers having energy higher than the barrier height caused by a band gap difference between the well layer and the barrier layer are reflected by the Bragg reflection. A condition of the thickness of the semiconductor layer that configures the well layer and the barrier layer at this time, namely, a reflection condition of carriers by the semiconductor layer that configures the well layer and the barrier layer, can be represented by the expressions (2) and (3) given below.

In the expressions, $L_1$ and $L_2$ indicate the thickness of the well layer and the thickness of the barrier layer, respectively. Further, m and n are integers. Further, $m_1^*$ and $m_2^*$ indicate an effective mass of carriers in the semiconductor that configures the well layer and an effective mass of carriers in the semiconductor that configures the barrier layer, respectively. Further, E indicates a vacuum level. Further, h indicates the Planck constant (conversion Planck constant). Further, $U_0$ indicates the barrier height caused by the band gap difference between the well layer and the barrier layer.

$$\frac{\sqrt{2m_1^* E}}{\eta} \cdot 2L_1 = (2m-1)\pi \quad (2)$$

$$\frac{\sqrt{2m_2^*(E-U_0)}}{\eta} CEL_2 = (2n-1)\pi \quad (3)$$

By using such an MQB structure as described above, as depicted in FIGS. 4A and 4B, where a bulk barrier layer having a band gap same as that of the barrier layer that has a band gap greater than that of the well layer is used, a barrier ($q\phi_{MQB}$) having a height greater than the height ($q\phi_b$) of the hetero junction barrier generated by the band gap difference can be implemented.

In the present embodiment, as depicted in FIG. 12B, the p-side MQB structure 14 provided in the p-type GaAsSb layer 10 is configured by providing a plurality of p-type AlGaSb layers 16 in the p-type GaAsSb layer 10. In particular, the p-side MQB structure 14 is configured by alternately stacking the p-type GaAsSb layer 10 and the p-type AlGaSb layer 16 in the proximity of the pn junction portion 13 of the p-type GaAsSb layer 10.

In particular, the p-side MQB structure 14 is configured by alternately stacking the $p^+$-GaAs$_{0.51}$Sb$_{0.49}$ layers 10 having the thickness of approximately 5 nm and the $p^+$-Al$_{0.2}$Ga$_{0.8}$Sb layers 16 that have thicknesses that successively and gradually decrease thereamong like approximately 3 nm, approximately 3 nm, approximately 2.5 nm, approximately 2.5 nm, approximately 2 nm, approximately 2 nm, approximately 1.5 nm and approximately 1.5 nm. Here, the $p^+$-GaAs$_{0.51}$Sb$_{0.49}$ layers 10 have a band gap Eg of approximately 0.78 eV and a doping concentration of $1 \times 10^{19}$ cm$^{-3}$. Meanwhile, the $p^+$-Al$_{0.2}$Ga$_{0.8}$Sb layers 16 have a band gap Eg of approximately 0.95 eV and a doping concentration of $1 \times 10^{19}$ cm$^{-3}$.

It is to be noted that such p-type AlGaSb layers 16 as described above are each referred to sometimes as barrier layer, p-side barrier layer or p-type barrier layer. Meanwhile, each p-type GaAsSb layer 10 sandwiched by the p-type AlGaSb layers 16 is referred to sometimes as well layer, p-side well layer or p-type well layer. Further, while the $p^+$-GaAs$_{0.51}$Sb$_{0.49}$ layer 10 is used as the well layer here, the well layer is not limited to this and a p-InGaAsSb layer (Eg<0.78 eV) that has a band gap Eg smaller than that of the layer 10 or the like may be used. In this instance, a $p^+$-GaAs$_{0.51}$Sb$_{0.49}$ layer may be used as the p-type semiconductor layer and a p-InGaAsSb layer (Eg<0.78 eV) may be used as the well layer of the p-side MQB structure 14. Further, a p-InGaAsSb layer (Eg<0.78 eV) may be used for both of the p-type semiconductor layer and the well layers of the p-side MQB structure 14. In this manner, a p-GaAsSb layer, a p-InGaAsSb layer or a like layer may be used for the well layer. Further, while the $p^+$-Al$_{0.2}$Ga$_{0.8}$Sb layer 16 is used for the barrier layer, the barrier is not limited to this and a p-Al$_x$Ga$_{1-x}$Sb (x>0) layer (Eg>0.78 eV) that has a band gap Eg greater than that of the well layer, namely, a band gap Eg greater than approximately 0.78 eV, may be used. It is to be noted that, when increasing the band gap of the well layer, by using, for example, AlAsSb or the like, the band gap of the barrier layer may be greater than that of the well layer. Further, while the thicknesses of the $p^+$-Al$_{0.2}$Ga$_{0.8}$Sb layers 16 are made different from each other, the $p^+$-Al$_{0.2}$Ga$_{0.8}$Sb layers 16 may have a fixed thickness. Further, while the $p^+$-Al$_{0.2}$Ga$_{0.8}$Sb layers 16 have thicknesses that are made different thereamong so as to gradually decrease, the layers 16 may otherwise have thicknesses that are made different thereamong so as to gradually increase.

Figure 8A:
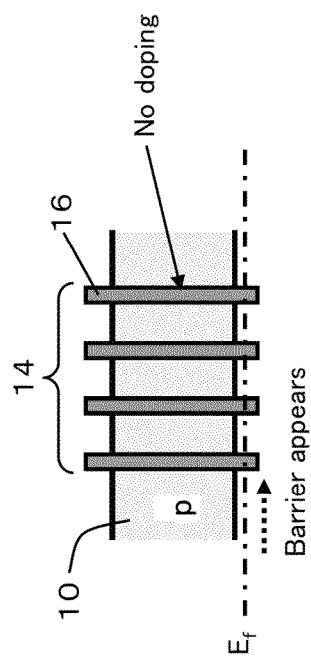
Figure 8B:
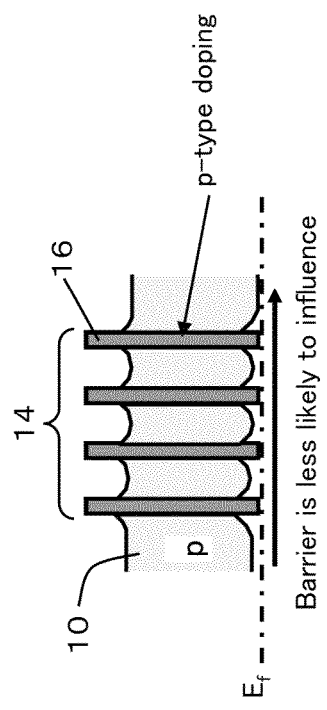

Further, the p-side barrier layers 16 that configure the p-side MQB structure 14 may be non-doped. However, it is preferable to apply a p-type barrier layer doped in the p type to the p-side barrier layers 16. Consequently, such a situation that a barrier against electrons upon reverse bias is generated because the upper end of the valence band of the plural barrier layers 16 that configure the p-side MQB structure 14 comes to the lower side with respect to the upper end of the valence band of the p-type semiconductor layer 10 can be suppressed as depicted in FIGS. 8A and 8B. As a result, the influence of the barrier can be suppressed. However, as hereinafter described, it is necessary to form a portion that allow band-to-band tunneling of electrons at the pn junction portion 13 upon biasing in the reverse direction from one p-type AlGaAs layer 16 included in the p-side MQB structure 14 and one n-type InP layer 17 included in the n-side MQB structure 15 as depicted in FIG. 1B, thereby obtain a backward diode characteristic. It is to be noted that the band-to-band tunneling is hereinafter referred to sometimes as inter-band tunneling.

On the other hand, as depicted in FIG. 12B, the n-side MQB structure 15 provided in the n-type InGaAs layer 11 is configured by providing a plurality of n-type InP layers 17 in the n-type InGaAs layer 11. In particular, the n-side MQB structure 15 is configured by alternately stacking the n-type InGaAs layers 11 and the n-type InP layers 17 in the proximity of the pn junction portion 13 of the n-type InGaAs layer 11.

In particular, the n-side MQB structure 15 is formed by alternately stacking the n-$In_{0.53}Ga_{0.47}As$ layers 11 having the thickness of approximately 5 nm and the n-type InP layers 17 having thicknesses that are made different thereamong so as to gradually increase in order like approximately 1.5 nm, approximately 1.5 nm, approximately 2 nm, approximately 2 nm, approximately 2.5 nm, approximately 2.5 nm, approximately 3 nm and approximately 3 nm. Here, the n-$In_{0.53}Ga_{0.47}As$ layers 11 have a band gap Eg of approximately 0.74 eV and a doping concentration of $5 \times 10^{18}$ cm$^{-3}$. Further, such n-type InP layers 17 have a band gap Eg of approximately 1.35 eV and a doping concentration of $5 \times 10^{18}$ cm$^{-3}$.

It is to be noted that the n-type InP layer 17 is referred to sometime as barrier layer, n-side barrier layer or n-type barrier layer. Further, the n-type InGaAs layer 11 sandwiched by the n-type InP layers 17 is referred to sometime as well layer, n-side well layer or n-type well layer. Further, while the n-$In_{0.53}Ga_{0.47}As$ layer 11 is used as the well layer here, the well layer is not limited to this and an n-$In_xGa_{1-x}As$ (x>0.53) layer (Eg<0.74 eV), an n-InAlGaAs layer (Eg>0.74 eV) or a like layer that have a band gap Eg smaller than that of the layer 11 may be used. In this instance, an n-$In_{0.53}Ga_{0.47}As$ layer is used as the n-type semiconductor layer and an n-$In_xGa_{1-x}As$ (x>0.53) layer (Eg<0.74 eV) or an n-InAlGaAs layer (Eg>0.74 eV) may be used as the well layer of the n-side MQB structure 15. Further, an n-$In_xGa_{1-x}As$ (x>0.53) layer (Eg<0.74 eV) or an n-InAlGaAs layer (Eg>0.74 eV) may be used for both of the n-type semiconductor layer and the well layers of the n-side MQB structure 15. In this manner, an n-InGaAs layer, an n-InAlGaAs layer or a like layer may be used for the well layer. Further, while the n-type InP layer 17 is used as the barrier layer, the barrier layer is not limited to this, and an n-$In_xGa_{1-x}As$ (x>0.53) layer, an n-$In_xAl_{1-x}As$ (x>0.7), an n-InAlGaAs layer (Eg>0.74 eV) or a like layer that have a band gap greater than that of the well layer, namely, a band gap Eg greater than approximately 0.74 eV, may be used. In particular, an n-InP layer, an n-InGaAs layer, an n-InAlAs layer, an n-InAlGaAs layer or a like layer may be used for the barrier layer. However, where the band gap of the well layer is set smaller, the band gap of the barrier layer may greater than that of the well layer. Further, while the n-type InP layers 17 have different thicknesses, a fixed thickness may be used Further, while the n-type InP layers 17 have gradually increasing thicknesses thereamong, the n-type InP layers 17 may have gradually decreasing thicknesses thereamong.

Further, the n-side barrier layers 17 that configure the n-side MQB structure 15 may be non-doped. However, it is preferable to use n-type barrier layers doped in the n type as the n-side barrier layers 17. Consequently, it can be suppressed that a barrier against electrons upon biasing in the reverse direction is generated because the lower end of the conduction band of the plural barrier layers 17 that configure the n-side MQB structure 15 comes to the upper side with respect to the lower end of the conduction band of the n-type semiconductor layer 11. Consequently, the influence of the barrier can be reduced. However, as hereinafter described, it is necessary to form a portion that allows band-to-band tunneling of electrons at the pn junction portion 13 upon biasing in the reverse direction from one p-type AlAsSb layer 16 included in the p-side MQB structure 14 and one n-type InP layer 17 included in the n-side MQB structure 15 as depicted in FIG. 1B, thereby obtain a backward diode characteristic.

Where the MQB structures 14 and 15 are provided, the p-type GaAsSb layer 10 and the n-type InGaAs layer 11 are joined to each other at the pn junction portion 13 in such a manner as to sandwich therebetween one p-side AlGaSb layer (p-side barrier layer) 16 included in the p-side MQB structure 14 and one n-type InP layer (n-side barrier layer) 17 included in the n-side MQB structure 15 as depicted in FIGS. 1A to 1C. In this instance, a junction plane between one p-type AlGaSb layer 16 and one n-type InP layer 17 functions as a pn junction plane (pn junction interface). Then, the portion that allows band-to-band tunneling of electrons is formed at the pn junction portion 13 upon biasing in the reverse direction from the one p-type AlGaSb layer 16 and the one n-type InP layer 17.

Here, it is preferable to set the distance in a horizontal direction from the p side to the n side of the portion formed from the one p-type AlGaSb layer 16 and the one n-type InP layer 17 to 100 Å or less, namely, to 10 nm or less, in order that band-to-band tunneling of electrons is allowed. Here, the band is radially curved by doping so that the distance in the horizontal direction is set to 10 nm or less. Consequently, band-to-band tunneling of electrons in the valence band of the p-type semiconductor layers 10 and 16 occurs at the portion upon biasing in the reverse direction, and consequently, band-to-band tunneling current flows.

Figure 7A:
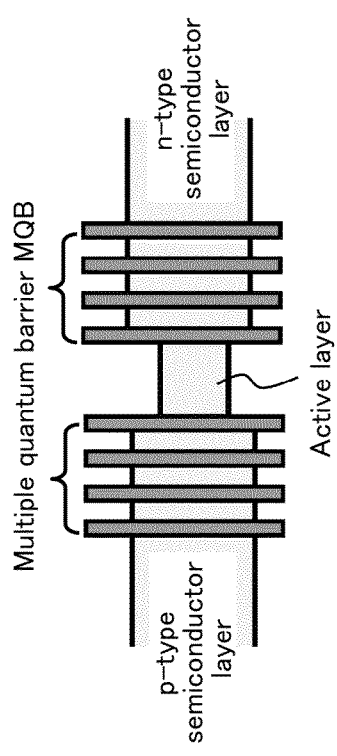
FIGS. 7A and 7B are schematic views illustrating an energy band structure in a flat band state where an MQB or an MQW is provided in a semiconductor laser including an active layer between a p-type semiconductor layer and an n-type semiconductor layer.
Figure 7B:
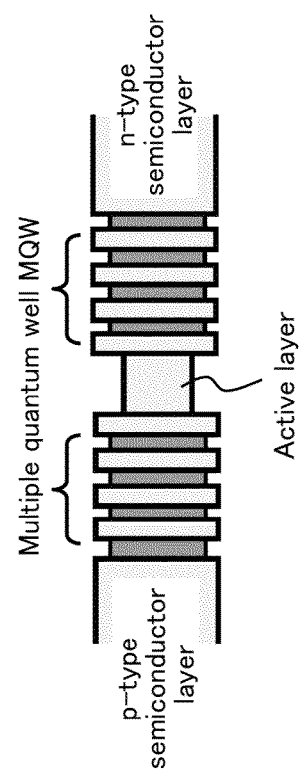

In this instance, the present backward diode includes, on opposite sides of the pn junction plane, the MQB structures 14 and 15 having such a band structure that band-to-band tunneling of electros is allowed upon biasing in the reverse direction. Here, the p-side MQB structure 14, namely, the p-type GaAsSb layer 10 on which the p-side MQB structure 14 is provided, and the n-side MQB structure 15 is provided, namely, the n-type InGaAs layer 11 on which the n-side MQB structure 15, individually have a type II band structure as depicted in FIG. 5, by which band-to-band tunneling is likely to occur. In particular, where the MQB structure or the MQW structure is provided in a device that includes an active layer between the p-type semiconductor layer and the n-type semiconductor layer such as a semiconductor laser, the device comes to have a type I band structure as depicted in FIGS. 7A and 7B. However, in the present embodiment, since the device has a type II band structure as depicted in FIG. 5, the band structure which is likely to allow band-to-band tunneling can be implemented.

Figure 6:
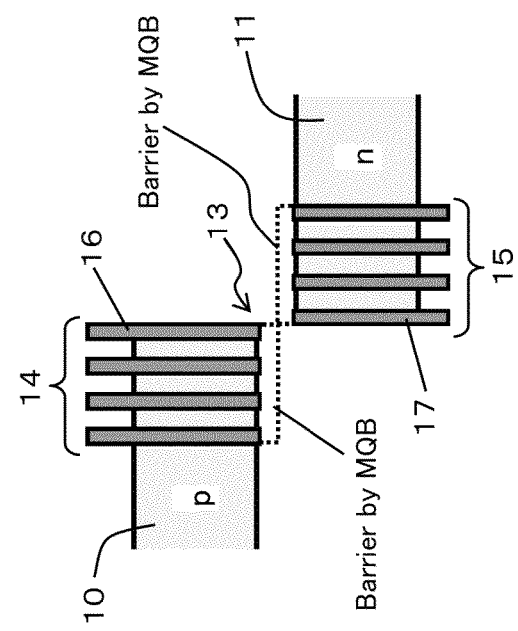
FIG. 6 is a schematic view illustrating an energy band structure in a flat band state in a semiconductor device (backward diode) of a modification to the first embodiment.

It is to be noted that, while, in the present embodiment, in a flat band state, the energy at the lower end of the conduction band of the n-type semiconductor layer 11 is higher than that at the upper end of the valence band of the p-type semiconductor layer 10 as depicted in FIG. 5, the energy condition is not limited to this. For example, in a flat band state, the energy at the lower end of the conduction band of the n-type semiconductor layer 11 may be set lower than that at the upper end of the valence band of the p-type semiconductor layer 10 as depicted in FIG. 6. This can be implemented by changing the materials and the compositions of the semiconductor materials that configure the p-type semiconductor layer 10 and the n-type semiconductor layer 11.

Figure 9:
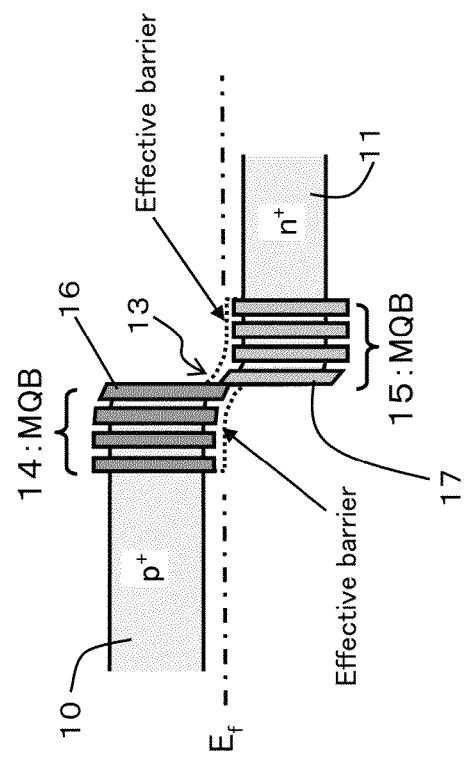
FIG. 9 is a schematic view depicting an energy band structure and illustrating an effect where doping is not carried out for barrier layers which configure the MQB structure provided in the semiconductor device (backward diode) of the first embodiment.

In this instance, the portion that allows band-to-band tunneling of electros is formed at the pn junction portion 13 upon biasing in the reverse direction from an effective barrier formed by the p-side MQB structure 14 and an effective barrier formed by the n-side MQB structure 15 as indicated by dotted lines in FIG. 6. Where the effective barrier formed on the valence band side of the p-type semiconductor layer 10 by the p-side MQB structure 14 and the effective barrier formed on the conduction band side of the n-type semiconductor layer 11 by the n-side MQB structure 15 are positively utilized in this manner, it is preferable to configure the barrier layers 16 and 17 that configure the MQB structures 14 and 15 as non-doped barrier layers. Consequently, a lower junction capacitance can be implemented, and high-speed operation of the device can be implemented. In this instance, the upper end of the valence band of the barrier layer 16 that configures the p-side MQB structure 14 comes to the lower side with respect to the upper end of the valence band of the p-type semiconductor layer 10 as depicted in FIG. 9 to make the effective barrier higher. Besides, the lower end of the conduction band of the barrier layer 17 that configures the n-side MQB structure 15 comes to the upper side with respect to the lower end of the conduction band of the n-type semiconductor layer 11 to make the effective barrier higher. Therefore, even if the band structure is different by a great amount between the p-type semiconductor layer 10 and the n-type semiconductor layer 11, namely, even if the energy difference between the lower end of the conduction band of the p-type semiconductor layer 10 and the lower end of the conduction band of the n-type semiconductor layer 11 is great and the energy difference between the upper end of the valence band of the p-type semiconductor layer 10 and the upper end of the valence band of the n-type semiconductor layer 11 is great, the backward diode characteristic can be obtained. It is to be noted that the barrier layers 16 and 17 that configure the MQB structures 14 and 15 may be doped. In this manner, the composition of the semiconductor material for configuring the p-type semiconductor layer 10, n-type semiconductor layer 11, p-side MQB structure 14 and n-side MQB structure 15 and whether or not doping is to be applied may be determined in order that the backward diode characteristic may be obtained.

Now, a fabrication method for the semiconductor device according to the present embodiment is described with reference to FIGS. 10A to 12B.

First, as depicted in FIG. 10A, an i-InAlAs buffer layer 21, an n-InGaAs ohmic contact layer 22, an n-InP etching stopping layer 23, an n-InGaAs layer 11 as an n-type semiconductor layer, n-type InP layers 17 and n-InGaAs layers 11 that configure the n-MQB structure 15, p-AlGaSb layers 16 and p-GaAsSb layers 10 that configure the p-MQB structure 14, and a p-GaAsSb layer 10 as a p-type semiconductor layer are successively formed, for example, on a semi-insulating InP substrate 20, for example, by an MOCVD method. It is to be noted that the uppermost side p-GaAsSb layer 10 is referred to sometimes as ohmic contact layer.

Here, the i-InAlAs buffer layer 21 has a thickness of approximately 300 nm. Further, the n-InGaAs ohmic contact layer 22 is an n$^+$-In$_{0.53}$Ga$_{0.47}$As layer having a doping concentration of approximately $1\times10^{19}$ cm$^{-3}$ and has a thickness of approximately 200 nm. Further, the n-InP etching stopping layer 23 has a doping concentration of approximately $1\times10^{18}$ cm$^{-3}$ and a thickness of approximately 5 nm. Further, the lowermost side n-InGaAs layer 11 is an n-In$_{0.53}$Ga$_{0.47}$As layer having a doping concentration of $5\times10^{18}$ cm$^{-3}$ and has a thickness of 50 nm.

Meanwhile, the n-MQB structure 15 is formed by alternately and repetitively stacking the n-InP layers 17 and the n-InGaAs layers 11. Here, each of the n-InP layers 17 has a doping concentration of $5\times10^{-18}$ cm$^{-3}$. Meanwhile, each of the n-InGaAs layers 11 is an n-In$_{0.53}$Ga$_{0.47}$As layer and has a doping concentration of $5\times10^{-18}$ cm$^{-3}$. Further, the thickness of the n-InGaAs layers 11 is set fixed while the thickness of the n-InP layers 17 is made different thereamong. Here, the thickness of each n-InGaAs layer 11 is set to approximately 5 nm, and the thickness $t_1$ of the n-InP layers 17 is made different thereamong so as to gradually increase in order like approximately 1.5 nm, approximately 1.5 nm, approximately 2 nm, approximately 2 nm, approximately 2.5 nm, approximately 2.5, approximately 3 nm and approximately 3 nm. It is to be noted here that, while the thickness of the n-InP layers 17 is made different thereamong, otherwise it may be set fixed. Further, while the thickness of the n-InP layers 17 is made different thereamong so as to gradually increase, otherwise it may be made different thereamong so as to gradually decrease.

Further, the p-MQB structure 14 is formed by alternately and repetitively stacking the p-AlGaSb layers 16 and the p-GaAsSb layers 10. Here, each of the p-AlGaSb layers 16 is a p$^+$-Al$_{0.2}$Ga$_{0.8}$Sb layer having a doping concentration of $1\times10^{19}$ cm$^{-3}$. Further, each of the p-GaAsSb layers 10 is a p$^+$-GaAs$_{0.51}$Sb$_{0.49}$ layer having a doping concentration of $1\times10^{19}$ cm$^{-3}$. Further, the thickness of the p-GaAsSb layers 10 is set fixed while the thickness of the p-AlGaSb layers 16 is made different thereamong. Here, the thickness of the p-GaAsSb layers 10 is set to approximately 5 nm, and the thickness $t_2$ of the p-AlGaSb layers 16 is made different thereamong so as to gradually decrease in order like approximately 3 nm, approximately 3 nm, approximately 2.5 nm, approximately 2.5 nm, approximately 2 nm, approximately 2 nm, approximately 1.5 nm and approximately 1.5 nm. It is to be noted here that, while the thickness of the p-AlGaSb layers 16 is made different thereamong, otherwise it may be set fixed. Further, while the thickness of the p-AlGaSb layers 16 is made different thereamong so as to gradually decrease, it may otherwise be made different thereamong so as to gradually increase.

Further, the uppermost side p-GaAsSb layer 10 is a p$^+$-GaAs$_{0.51}$Sb$_{0.49}$ layer that has a doping concentration of $2\times10^{19}$ cm$^{-3}$ and has a thickness of approximately 50 nm.

Then, a diode mesa region is defined, for example, by photoresist, and, as depicted in FIG. 10B, the uppermost side p-GaAsSb layer 10 and the p-MQB structure 14 are etched, for example, by mixture liquid of phosphoric acid and hydrogen peroxide water, and then the n-MQB structure 15 including P is removed, for example, by CH$_4$-based dry etching. Then, the lowermost side n-InGaAs layer 11 is removed using mixture liquid of phosphoric acid and hydrogen peroxide water again and then the etching is stopped at the n-InP etching stopping layer 23. Then, the n-InP etching stopping layer 23 is etched as depicted in FIG. 11A, for example, by hydrochloric acid. This etching is stopped at the n-InGaAs ohmic contact layer 22. The resist is removed here.

Then, an element isolation region is defined by resist 24 as depicted in FIG. 11B, for example, using photolithography. Then, the n-InGaAs ohmic contact layer 22 is etched, for example, by mixture liquid of phosphoric acid and hydrogen peroxide water until the i-InAlAs buffer layer 21 is exposed. Thereafter, the resist 24 is removed.

Then, an electrode region is defined by resist 25 as depicted in FIG. 12A, for example, using photolithography. Then, for example, Ti (approximately 10 nm thick)/Pt (approximately 30 nm thick)/Au (approximately 300 nm thick) is vapor-deposited as depicted in FIG. 12B, and an upper electrode 26 and a lower electrode 27 of the diode are formed at the same time by a lift off method. The backward diode 12 provided in the semiconductor device of the present embodiment is fabricated in this manner.

Accordingly, with the semiconductor device according to the present embodiment, there is an advantage that leakage current upon biasing in the forward direction of the backward diode 12 can be suppressed. Further, there is another advantage that the detection characteristic of the detector 3 using the backward diode 12 and hence the characteristic of the receiver 1 can be improved.

Figure 13:
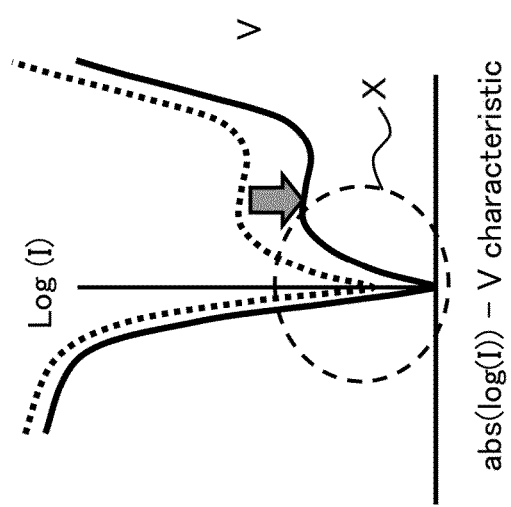
FIG. 13 is a schematic view illustrating an effect by the semiconductor device (backward diode) of the first embodiment.

Here, if the characteristic where current of the backward diode in the embodiment described above is logarithm-plotted is viewed, then it is recognized that the leakage component of current is suppressed as indicated by an arrow mark in FIG. 13. Particularly, it is recognized that current flowing at a portion indicated by reference character X in FIG. 13 is suppressed. Consequently, since the value of the curvature coefficient γ calculated in accordance with the expression (1) given hereinabove increases, a satisfactory detection characteristic is obtained where the backward diode in the embodiment described above is used for the detector to detect a weak radio wave of, for example, a millimeter wave band, a terahertz wave band or a like band.

It is to be noted that, while, in the embodiment described above, one p-type AlGaSb layer (p-side barrier layer) 16 included in the p-side MQB structure 14 and one n-type InP layer (n-side barrier layer) 17 included in the n-side MQB structure 15 are joined to each other, the junction is not limited to this. For example, one p-type GaAsSb layer (p-side well layer) included in the p-side MQB structure and one n-type InGaAs layer (n-side well layer) included in the n-side MQB structure may be joined to each other. Or, for example, one p-type AlGaSb layer (p-side barrier layer) included in the p-side MQB structure and one n-type InGaAs layer (n-side well layer) included in the n-side MQB structure may be joined to each other. Or else, for example, one p-GaAsSb layer (p-side well layer) included in the p-side MQB structure and one n-type InP layer (n-side barrier layer) included in the n-side MQB structure may be joined to each other.

Figure 18A:
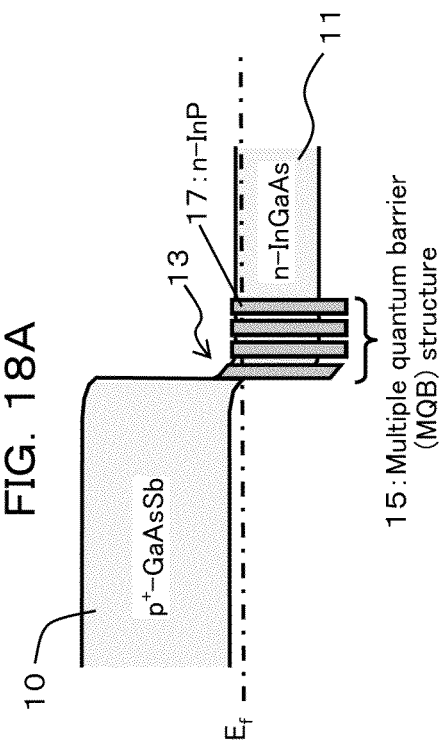
Figure 18C:
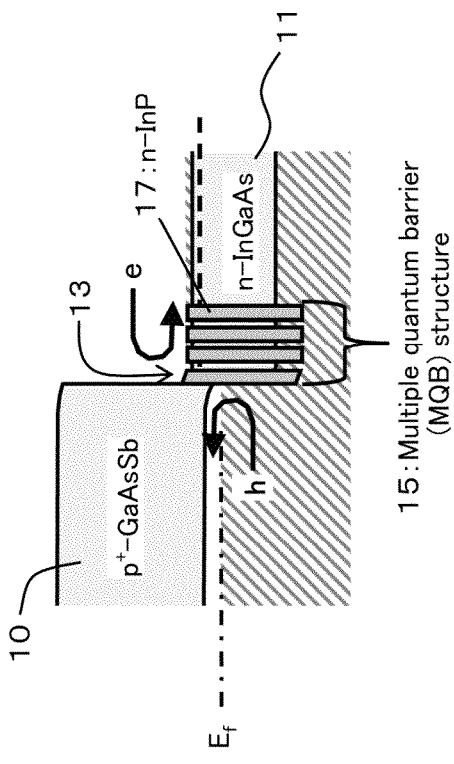
Figure 18B:
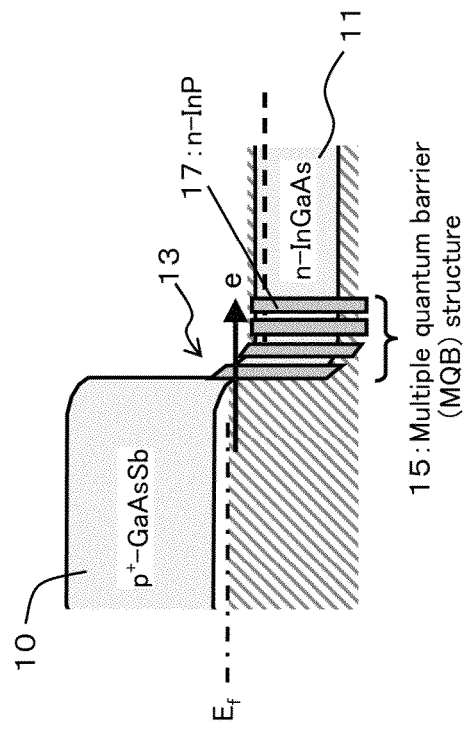

Further, while, in the embodiment described above, the MQB structures 14 and 15 are provided in both of the p-type GaAsSb layer (p-type semiconductor layer) 10 and the n-type InGaAs layer (n-type semiconductor layer) 11, the arrangement of the MQB structures is not limited to this. In particular, the MQB structure may be provided in at least one of the p-type GaAsSb layer (p-type semiconductor layer) 10 and the n-type InGaAs layer (n-type semiconductor layer) 11. In particular, as the MQB structure, only the p-side MQB structure 14 disposed in the p-type GaAsSb layer 10 may be provided as depicted in FIGS. 14A to 14C, or only the n-side MQB structure 15 disposed in the n-type InGaAs layer 11 may be provided as depicted in FIGS. 18A to 18C.

For example, where the MQB structure 14 is provided only in the p-type GaAsSb layer 10, at the pn junction portion 13, the p-type GaAsSb layer 10 and the n-type InGaAs layer 11 are joined to each other in such a manner as to sandwich therebetween one p-type AlGaSb layer (barrier layer) 16 included in the MQB structure 14 as depicted in FIGS. 14A to 14C. In this instance, a junction plane between one p-type AlGaSb layer 16 and n-type InGaAs layer 11 serves as the pn junction plane. Then, from the one p-type AlGaSb layer 16 and the n-type InGaAs layer 11, a portion that allows band-to-band tunneling of electrons is formed at the pn junction portion 13 upon biasing in the reverse direction. Here, it is preferable to set the distance in a horizontal direction of the portion formed from the one p-type AlGaSb layer 16 and the n-type InGaAs layer 11 to 10 Å or less, namely, to 10 nm or less, so that band-to-band tunneling of electrons is allowed. Consequently, upon biasing in the reverse direction, band-to-band tunneling of electrons on the valence band of the p-type semiconductor layers 10 and 16 occurs at the portion and band-to-band tunneling current flows.

Figure 15A:
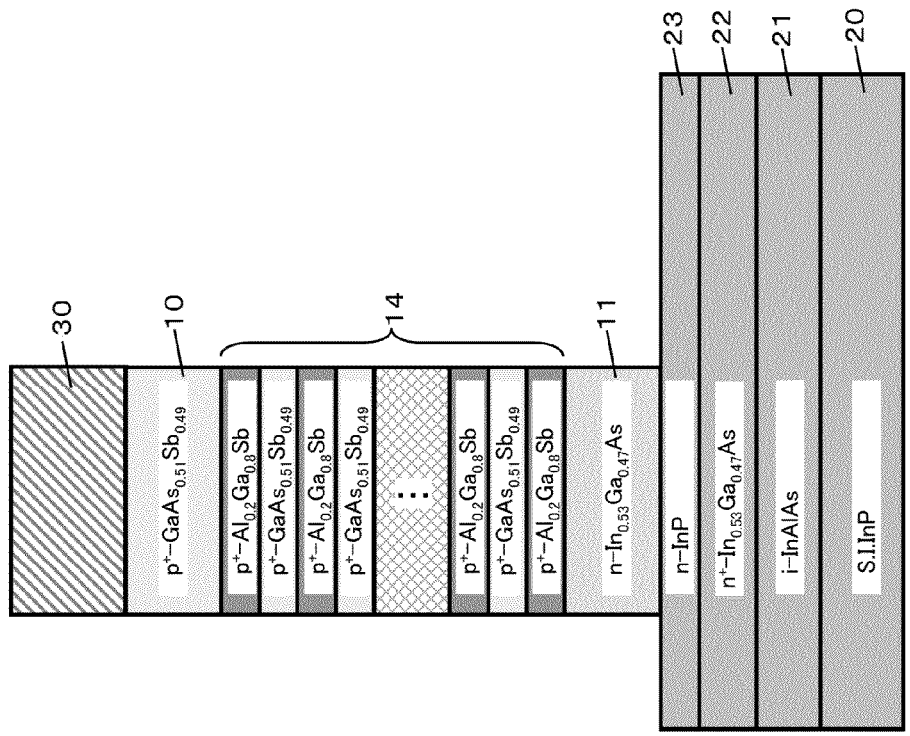
FIGS. 15A and 15B are schematic sectional views illustrating a fabrication method for the semiconductor device (backward diode) of the modification to the first embodiment.

In this instance, as depicted in FIG. 15A, the i-InAlAs buffer layer 21, n-InGaAs ohmic contact layer 22, n-InP etching stopping layer 23, n-InGaAs layer 11 as the n-type semiconductor layer, p-AlGaSb layers 16 and p-GaAsSb layers 10 that configure the p-MQB structure 14, and p-GaAsSb layer 10 as the p-type semiconductor layer are formed, for example, on the semi-insulating InP substrate 20, for example, by an MOCVD method.

Figure 15B:
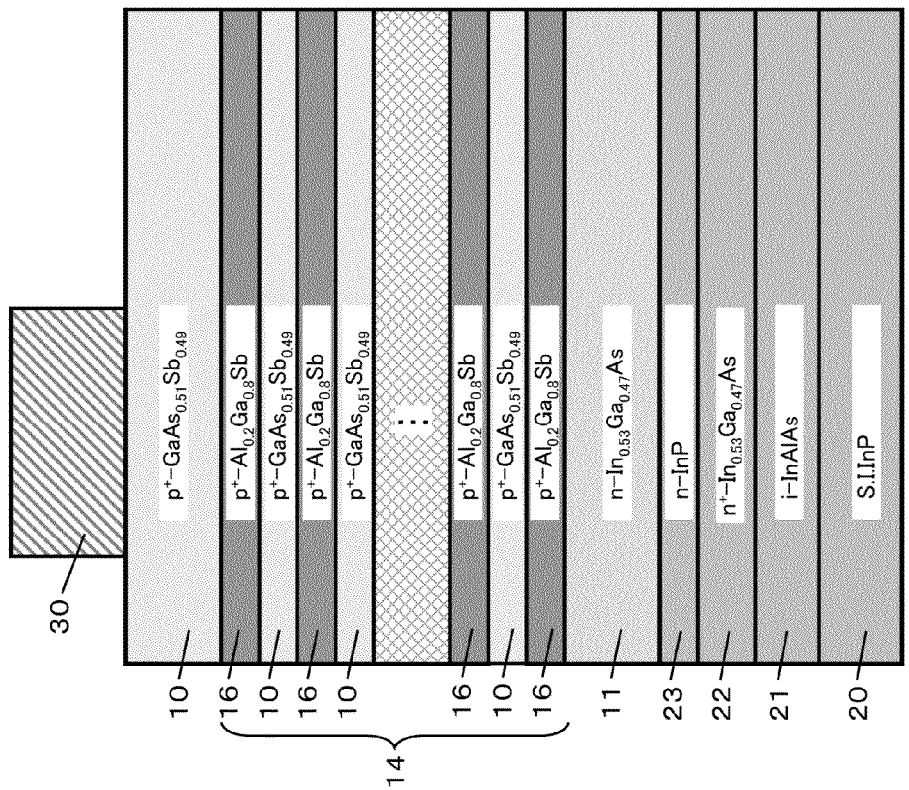

Then, a diode mesa region is defined, for example, by photoresist 30, and the uppermost side p-GaAsSb layer 10, p-MQB structure 14 and n-InGaAs layer 11 are etched as depicted in FIG. 15B, for example, using mixture liquid of phosphoric acid and hydrogen peroxide water. Then, after the n-InGaAs layer 11 is removed, the etching is stopped at the n-InP etching stopping layer 23.

Thereafter, similarly as in the case of the embodiment described above, the n-InP etching stopping layer 23 is etched and the resist 30 is removed as depicted in FIG. 16A. Then, an element isolation region is defined by resist 31 and the n-InGaAs ohmic contact layer 22 is etched and then the resist 31 is removed as depicted in FIG. 16B. Then, an electrode region is defined by resist 32 as depicted in FIG. 17A, and the upper electrode 26 and the lower electrode 27 are formed to fabricate the backward diode 12 as depicted in FIG. 17B.

On the other hand, for example, where the MQB structure 15 is provided only in the n-type InGaAs layer 11, the p-type GaAsSb layer 10 and the n-type InGaAs layer 11 are joined to each other at the pn junction portion 13 in such a manner as to sandwich therebetween one n-InP layer (barrier layer) 17 included in the MQB structure 15 as depicted in FIGS. 18A to 18C. In this instance, a junction plane between the p-type GaAsSb layer 10 and one n-InP layer 17 serves as the pn junction plane. Then, from the p-type GaAsSb layer 10 and the one n-InP layer 17, a portion that allows band-to-band tunneling of electrons is formed at the pn junction portion 13 upon biasing in the reverse direction. Here, it is preferable to set the distance in a horizontal direction of the portion formed from the p-type GaAsSb layer 10 and the one n-InP layer 17 to 100 Å or less, namely, to 10 nm or less, so that band-to-band tunneling of electrons is allowed. Consequently, upon biasing in the reverse direction, band-to-band tunneling of electrons on the valence band of the p-type semiconductor layer 10 occurs at the portion and band-to-band tunneling current flows.

Figure 19A:
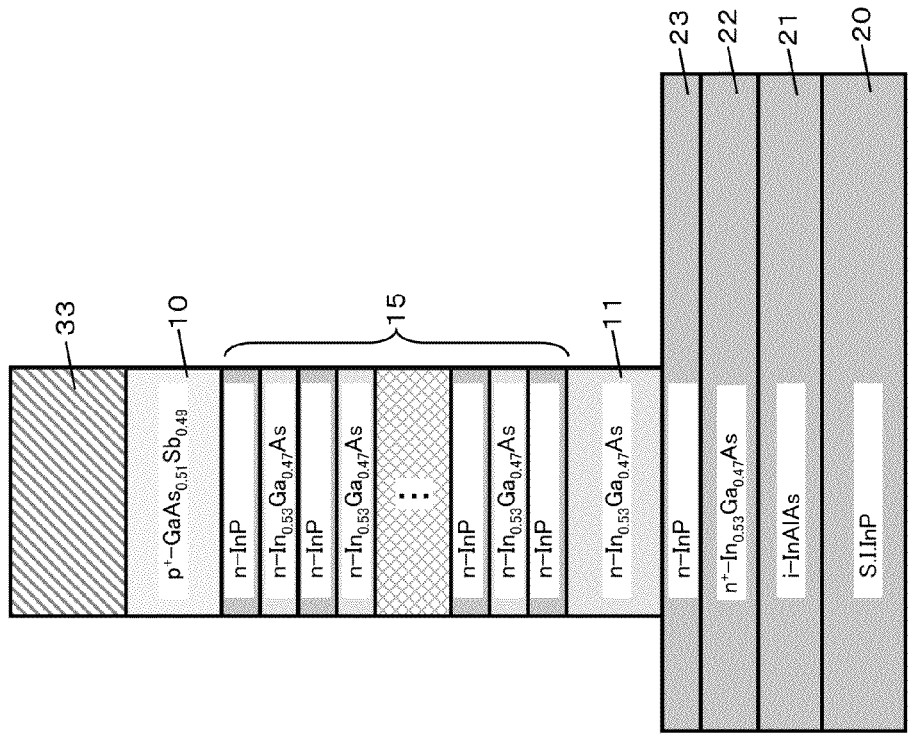
FIGS. 19A and 19B are schematic sectional views illustrating a fabrication method for the semiconductor device (backward diode) of another modification to the first embodiment.

In this instance, the i-InAlAs buffer layer 21, n-InGaAs ohmic contact layer 22, n-InP etching stopping layer 23, n-InGaAs layer 11 as the n-type semiconductor layer, n-InP layers 17 and n-InGaAs layer 11 that configure the n-MQB structure 15 and p-GaAsSb layer 10 as the p-type semiconductor layer are formed, for example, on the semi-insulating InP substrate 20 as depicted in FIG. 19A, for example, by an MOCVD method.

Figure 19B:
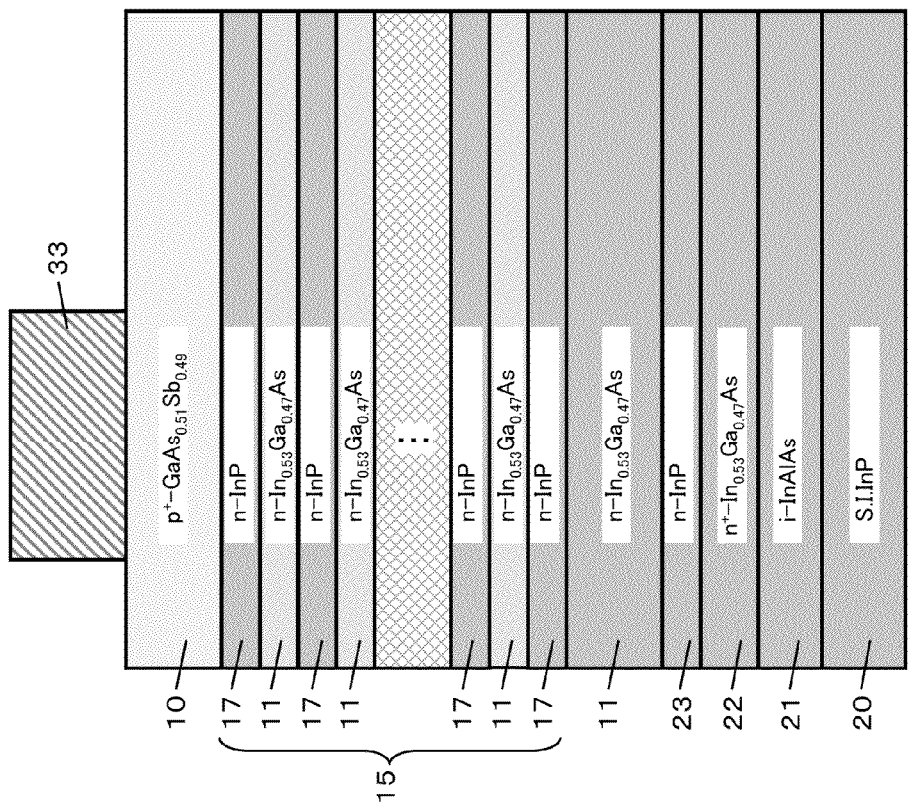

Then, a diode mesa region is defined, for example, by photoresist 33, and the p-GaAsSb layer 10 is etched as depicted in FIG. 19B, for example, using mixture liquid of phosphoric acid and hydrogen peroxide water and then the n-MQB structure 15 including P is removed, for example, by $CH_4$-based dry etching. Then, after the lowermost n-InGaAs layer 11 is removed using mixture liquid of phosphoric acid and hydrogen peroxide water again, the etching is stopped at the n-InP etching stopping layer 23.

Figure 21A:
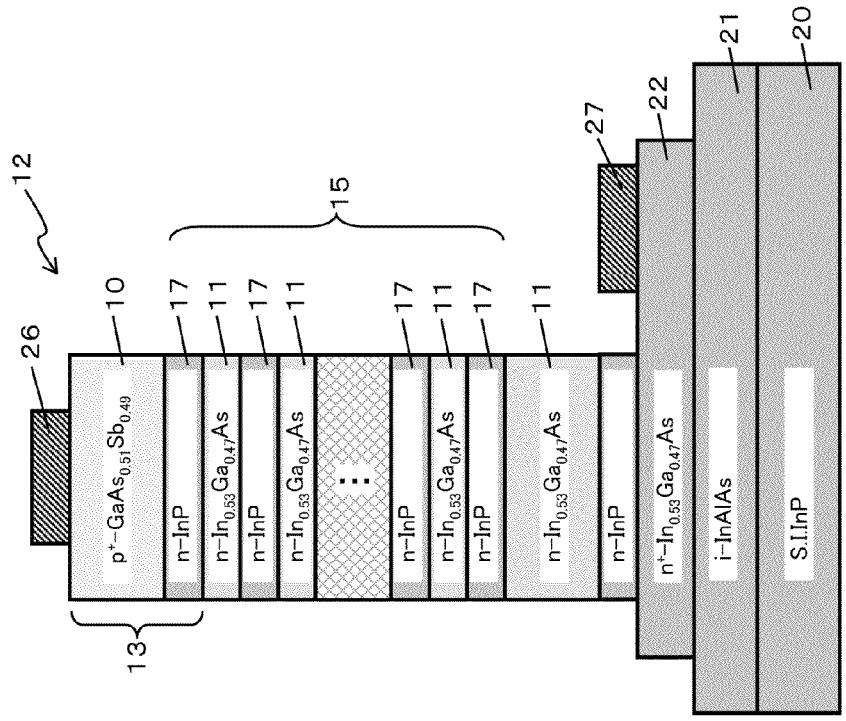
FIGS. 21A and 21B are schematic sectional views illustrating the fabrication method for and a configuration of the semiconductor device (backward diode) of another modification to the first embodiment.
Figure 21B:
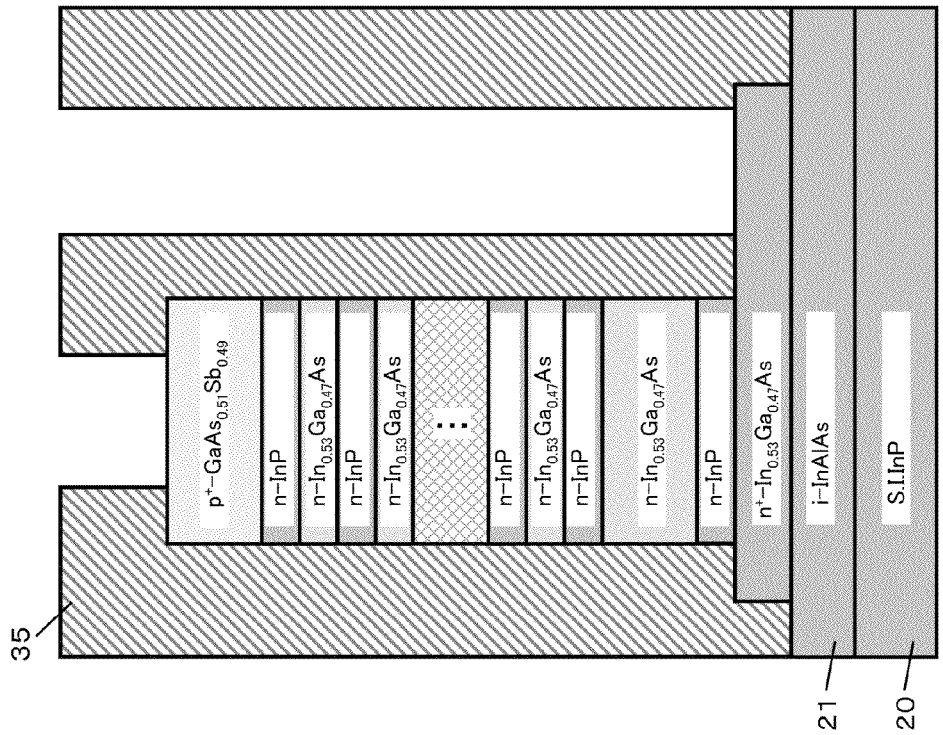

Thereafter, similarly as in the case of the embodiment described above, the n-InP etching stopping layer 23 is etched and the resist 33 is removed as depicted in FIG. 20A. Then, an element isolation region is defined by resist 34 and the n-InGaAs ohmic contact layer 22 is etched and then the resist 34 is removed as depicted in FIG. 20B. Then, an electrode region is defined by resist 35 as depicted in FIG. 21A, and the upper electrode 26 and the lower electrode 27 are formed as depicted in FIG. 21B to fabricate the backward diode 12.

Figures 22A, 22B:
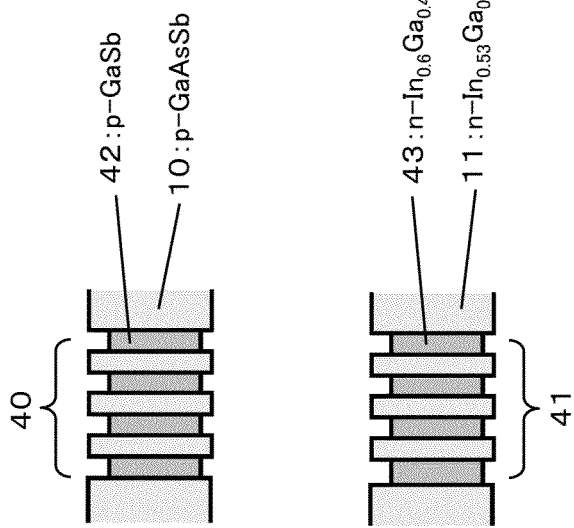
FIGS. 22A and 22B are schematic views illustrating an energy band structure of the semiconductor device (backward diode) of a different modification to the first embodiment.

Incidentally, while, in the embodiment described above, the p-side MQB structure 14 and the n-side MQB structure 15 that function as the barriers against electrons and holes upon biasing in the forward direction are provided, the structures to be provided are not limited to them. For example, in place of the MQB structures 14 and 15, multiple quantum well (MQW) structures 40 and 41 that function as the barriers against electrons and holes, respectively, upon biasing in the forward direction may be provided as depicted in a band structure of FIGS. 22A and 22B.

Figure 23:
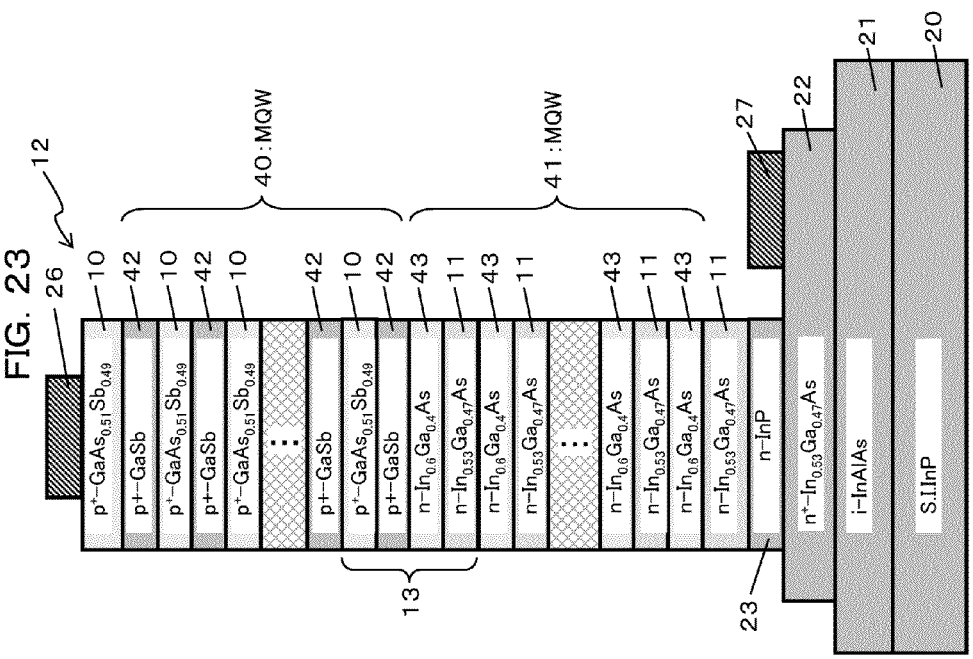
FIG. 23 is a schematic sectional view illustrating a configuration of the semiconductor device (backward diode) of the different modification to the first embodiment.

For example, the p-side MQW structure 40 provided in the p-type GaAsSb layer 10 may be configured by providing a plurality of p-type GaSb layers 42 in the p-type GaAsSb layers 10 as depicted in FIG. 23. In particular, the p-side MQW structure 40 may be configured by alternately stacking the p-type GaAsSb layers 10 and the p-type GaSb layers 42 in the proximity of the pn junction portion 13 of the p-type GaAsSb layer 10.

In particular, the p-side MQW structure 40 is formed by alternately and repetitively stacking the p-type GaAsSb layers 10 and the p-type GaSb layers 42. Here, each of the p-type GaAsSb layers 10 is a $p^+$-$GaAs_{0.51}Sb_{0.49}$ layer having a band gap Eg of approximately 0.78 eV and a doping concentration of $1 \times 10^{19}$ $cm^{-3}$. Further, each of the p-type GaSb layers 42 is a $p^+$-GaSb layer having a band gap Eg of approximately 0.75 eV and a doping concentration of $1 \times 10^{19}$ $cm^{-3}$. Further, the thickness of the p-type GaSb layers 42 is set fixed but the thickness of the p-type GaAsSb layers 10 is mode different thereamong. Here, the thickness of each p-type GaSb layer 42 is set to approximately 5 nm, and the thickness of each p-type GaAsSb layer 10 is set so as to gradually decrease thereamong in order like approximately 3 nm, approximately 3 nm, approximately 2.5 nm, approximately 2.5 nm, approximately 2 nm, approximately 2 nm, approximately 1.5 nm and approximately 1.5 nm.

It is to be noted that such p-type GaSb layer 42 is hereinafter referred to sometimes as well layer, p-side well layer or p-type well layer. Further, such p-type GaAsSb layer 10 sandwiched by the p-type GaSb layers 42 is hereinafter referred to sometimes as barrier layer, p-side barrier layer or a p-type barrier layer. Further, while the p-type GaSb layer 42 is used here as the well layer, the well layer is not limited to this, and a p-InGaAsSb layer (Eg<0.78 eV), a p-InGaSb layer (Eg<0.78 eV), a p-AlGaSb layer (Eg<0.78 eV) or a like layer that have a band gap Eg smaller than that of the barrier layer, namely, a band gap Eg smaller than approximately 0.78 eV, may be used. In particular, as the well layer, a p-GaSb layer, a p-InGaAsSb layer, a p-InGaSb layer, a p-AlGaSb layer, a p-InAsSb layer or a like layer may be used. It is to be noted that, as hereinafter described, when increasing the band gap of the barrier layer, the band gap of the well layer may be smaller than that of the barrier layer. Further, while the $p^+$-$GaAs_{0.51}Sb_{0.49}$ layer 10 is used as the barrier layer, the barrier layer is not limited to this, and a p-InGaAsSb layer (Eg>0.78 eV) that has a band gap Eg greater than that of the layer 10 may be used. In this instance, a $p^+$-$GaAs_{0.51}Sb_{0.49}$ layer may be used as the p-type semiconductor layer and a p-InGaAsSb layer (Eg>0.78 eV) may be used as the barrier layer of the p-side MQW structure 40. Further, a p-InGaAsSb layer (Eg>0.78 eV) may be used for both of the p-type semiconductor layer and the barrier layer of the p-side MQW structure 40. In this manner, a p-GaAsSb layer, a p-InGaAsSb layer or a like layer may be used for the barrier layer. Further, while the thickness of the p-type GaAsSb layers 10 are made different from each other, the p-type GaAsSb layers 10 may have a fixed thickness. Further, while the thickness of the p-type GaAsSb layers 10 is made different thereamong so as to gradually decrease, the thickness may be made different thereamong so as to gradually increase. Further, the thickness of the barrier layers may be set fixed while the thickness of the well layers is made different thereamong. Further, while it is preferable to use a doped p-type well layer for the p-side GaSb layers 42, a non-doped p-type well layer may be used.

Further, the n-side MQW structure 41 provided in the n-type InGaAs layer 11 may be configured by providing a plurality of n-type InGaAs layers 43 that are different in composition from the n-type InGaAs layer 11 on the n-type InGaAs layer 11. In particular, the n-side MQW structure 41 provided in the n-type InGaAs layer 11 may be configured by providing a plurality of n-type InGaAs layers 43 having a band gap smaller than that of the n-type InGaAs layer 11 on the n-type InGaAs layer 11. Here, the n-side MQW structure 41 is configured by providing a plurality of n-type $In_{0.6}Ga_{0.4}As$ layers 43 having a band gap Eg of approximately 0.68 eV on the n-type $In_{0.53}Ga_{0.47}As$ layer 11 having a band gap Eg of approximately 0.74 eV. In particular, the n-side MQW structure 41 is configured by alternately and repetitively stacking the n-type $In_{0.53}Ga_{0.47}As$ layers 11 and the n-type $In_{0.6}Ga_{0.4}As$ layers 43 in the proximity of the pn junction portion 13 of the n-type $In_{0.53}Ga_{0.47}As$ layer 11.

Here, each of the n-type $In_{0.53}Ga_{0.47}As$ layers 11 has a doping concentration of $5 \times 10^{18}$ $cm^{-3}$. Further, each of the n-type $In_{0.6}Ga_{0.4}As$ layers 43 has a doping concentration of $5 \times 10^{18}$ $cm^{-3}$. Further, the thickness of the n-type $In_{0.6}Ga_{0.4}As$ layers 43 is set fixed while the thickness of the n-type $In_{0.53}Ga_{0.47}As$ layers 11 is made different from each other. Here, the thickness of the n-type $In_{0.6}Ga_{0.4}As$ layers 43 is set to approximately 5 nm, and the thickness of the n-type $In_{0.53}Ga_{0.47}As$ layers 11 is made different thereamong so as to gradually increase in order like approximately 1.5 nm, approximately 1.5 nm, approximately 2 nm, approximately 2 nm, approximately 2.5 nm, approximately 2.5 nm, approximately 3 nm and approximately 3 nm.

It is to be noted that such n-type $In_{0.6}Ga_{0.4}As$ layer 43 is hereinafter referred to sometimes as well layer, n-side well layer, or n-type well layer. Further, such n-type $In_{0.53}Ga_{0.47}As$ layer 11 sandwiched by the n-type $In_{0.6}Ga_{0.4}As$ layers 43 is hereinafter referred to sometimes as barrier layer, n-side barrier layer or n-type barrier layer. Further, while the n-type $In_{0.6}Ga_{0.4}As$ layer 43 here is used as the well layer, the well layer is not limited to this, and an n-In- $_x$Ga$_{1-x}$As (x>0.53) layer (Eg<0.74 eV), an n-InAlGaAs layer (Eg<0.74 eV) or a like layer that have a band gap Eg smaller than that of the barrier layer, namely, a band gap Eg smaller than approximately 0.74 eV, may be used. In particular, an n-InGaAs layer, an n-InAlGaAs layer, an n-InAsSb layer or a like layer may be used for the well layer. It is to be noted that, when reducing the band gap of the barrier layer as hereinafter described, the band gap of the well layer may be smaller than that of the barrier layer. Further, while the n-type In$_{0.53}$Ga$_{0.47}$As layer 11 are used as the barrier layer, the barrier layer is not limited to this. In particular, an n-In$_x$Ga$_{1-x}$As (x>0.53) layer (Eg<0.74 eV), an n-InAlGaAs layer (Eg<0.74 eV) or a like layer that have a band gap Eg smaller than that of the layer 11 may be used. In this instance, an n-In$_x$Ga$_{1-x}$As layer whose band gap is smaller than that of the barrier layer may be used for the well layer. Conversely, an n-In$_x$Ga$_{1-x}$As (x<0.53) layer (Eg>0.74 eV), an n-InAlGaAs layer (Eg>0.74 eV) or a like layer that have a band gap Eg greater than that of the layer 11 may be used for the barrier layer. Further, an n-In$_x$Ga$_{1-x}$As (x<0.53) layer (Eg>0.74 eV), an n-InAlGaAs layer (Eg>0.74 eV) or a like layer that have a band gap Eg greater than that of the layer 11 may be used for both of the n-type semiconductor layer and the barrier layers of the n-side MQW structure 41. In this instance, since the band gap of the well layer may be smaller than that of the barrier layer, an n-In$_x$Ga$_{1-x}$As layer, an n-InAlGaAs layer or a like layer that have a band gap greater than that of the well layer described above can be used for the well layer. Further, while the thickness of the n-type In$_{0.53}$Ga$_{0.47}$As layers 11 is made different thereamong, it may otherwise be set fixed. Further, while the thickness of the n-type In$_{0.53}$Ga$_{0.47}$As layers 11 is made different thereamong so as to gradually increase, it may otherwise be made different among the layers 11 so as to gradually decrease. Further, the thickness of the barrier layer may be set fixed while the thickness of the well layers is made different thereamong. Further, while it is preferable to use a doped n-type well layer for the n-side well layer 43, a non-doped n-type well layer may be used.

Where the MQW structures 40 and 41 described above are provided, the p-type GaAsSb layer 10 and the n-type InGaAs layer 11 are joined to each other at the pn junction portion 13 in such a manner as to sandwich therebetween one p-type GaSb layer (p-side well layer) 42 included in the p-side MQW structure 40 and one n-type InGaAs layer (n-side well layer) 43 included in the n-side MQW structure 41. In this instance, a junction plane between the one p-type GaSb layer 42 and the one n-type InGaAs layer 43 serves as a pn junction plane. Then, from the one p-type GaSb layer 42 and the one n-type InGaAs layer 43, a portion that allows band-to-band tunneling of electrons is formed at the pn junction portion 13 upon biasing in the reverse direction.

Here, it is preferable to set the distance in a horizontal direction of the portion formed from the one p-type GaSb layer 42 and the one n-type InGaAs layer 43 to 100 Å or less, namely, to 10 nm or less, in order that band-to-band tunneling of electrons is allowed. Here, the distance in a horizontal direction of the portion described above is set to 10 nm or less by radially curving a band by doping. Consequently, upon biasing in the reverse direction, band-to-band tunneling of electrons on the valence band of the p-type semiconductor layers 10 and 42 occurs at the portion and band-to-band tunneling current flows.

In this instance, the present backward diode 12 includes, on opposite sides of the pn junction plane, the MQW structures 40 and 41 having a band structure with which band-to-band tunneling of electrons is allowed upon biasing in the reverse direction. Here, the p-side MQW structure 40, namely, the p-type GaAsSb layer 10 on which the p-side MQW structure 40 is provided, and the n-side MQW structure 41, namely, the n-type InGaAs layer 11 on which the n-side MQW structure 41 is provided, individually have a type II band structure, with which band-to-band tunneling is likely to occur.

Further, similarly as in the case (refer to FIGS. 14A to 21B) of the modification to the embodiment described above, the MQW structure 40 or 41 may be provided in at least one of the p-type GaAsSb layer 10 and the n-type InGaAs layer 11. In particular, as the MQW structure, only the p-side MQW structure 40 may be provided in the p-type GaAsSb layer 10 or only the n-side MQW structure 41 may be provided in the n-type InGaAs layer 11.

For example, where the MQW structure 40 is provided only in the p-type GaAsSb layer 10, the p-type GaAsSb layer 10 and the n-type InGaAs layer 11 are joined to each other at the pn junction portion 13 in such a manner as to sandwich therebetween one p-type GaSb layer (well layer) 42 included in the MQW structure 40. In this instance, a joint plane between the one p-type GaSb layer 42 and the n-type InGaAs layer 11 serves as the pn junction plane. Then, from the one p-type GaSb layer 42 and the n-type InGaAs layer 11, a portion that allows band-to-band tunneling of electrons is formed at the pn junction portion 13 upon biasing in the reverse direction. Here, it is preferable to set the distance in a horizontal direction of the portion formed from the one p-type GaSb layer 42 and the n-type InGaAs layer 11 to 100 Å or less, namely, to 10 nm or less, in order that band-to-band tunneling of electrons is allowed. Consequently, upon biasing in the reverse direction, band-to-band tunneling of electrons on the valence band of the p-type semiconductor layers 10 and 42 occurs at the portion and band-to-band tunneling current flows.

On the other hand, for example, where the MQW structure 41 is provided only in the n-type InGaAs layer 11, the p-type GaAsSb layer 10 and the n-type InGaAs layer 11 are joined to each other at the pn junction portion 13 in such a manner as to sandwich therebetween one n-type InGaAs layer (well layer) 43 included in the MQW structure 41. In this instance, a junction plane between the p-type GaAsSb layer 10 and the one n-type InGaAs layer 43 serves as the pn junction plane. Then, from the p-type GaAsSb layer 10 and the one n-type InGaAs layer 43, a portion that allows band-to-band tunneling of electrons is formed at the pn junction portion 13 upon biasing in the reverse direction. Here, it is preferable to set the distance in a horizontal direction of the portion formed from the p-type GaAsSb layer 10 and the one n-type InGaAs layer 43 to 100 Å or less, namely, to 10 nm or less, in order that band-to-band tunneling of electrons is allowed. Consequently, upon biasing in the reverse direction, band-to-band tunneling of electrons on the valence band of the p-type semiconductor layer 10 occurs at the portion and band-to-band tunneling current flows.

Further, the embodiment described above and the modification described above may be combined such that the MQB structure 14 (15) is provided in one of the p-type GaAsSb layer 10 and the n-type InGaAs layer 11 while the MQW structure 40 (41) is provided in the other one of the p-type GaAsSb layer 10 and the n-type InGaAs layer 11.

Figure 24:
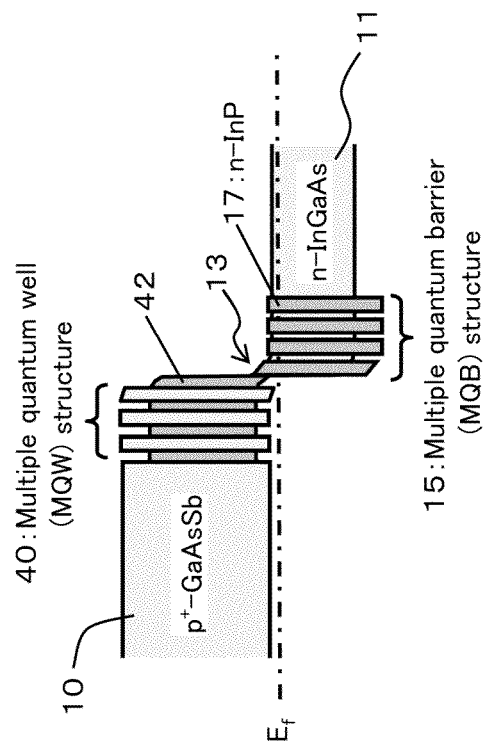
FIG. 24 is a schematic view illustrating an energy band structure of a semiconductor device (backward diode) of a further modification to the first embodiment and illustrating a balanced state in which a voltage is not applied.
Figure 25:
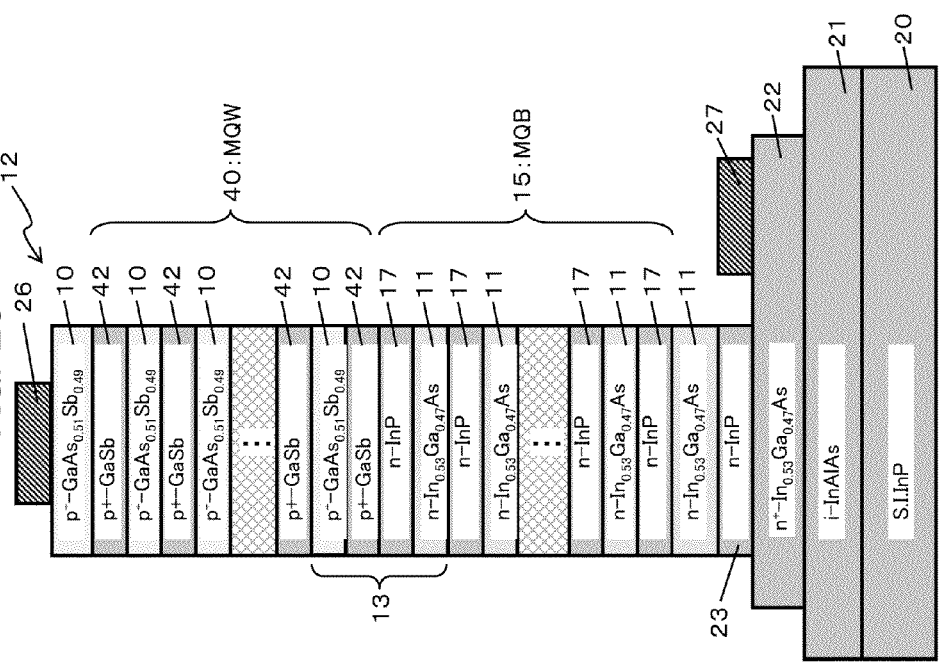
FIG. 25 is a schematic sectional view illustrating a configuration of the semiconductor device (backward diode) of the further modification to the first embodiment.

For example, the MQW structure 40 and the MQB structure 15 may be provided in the p-type GaAsSb layer 10 and the n-type InGaAs layer 11, respectively, as depicted in FIG. 24. In this instance, the MQW structure 40 provided in the p-type GaAsSb layer 10 may be configured by providing a plurality of p-type GaSb layers 42 on the p-type GaAsSb layer 10 as depicted in FIG. 25. In particular, the MQW structure 40 may be configured by alternately stacking the p-type GaAsSb layers 10 and the p-type GaSb layers 42 in the proximity of the pn junction portion 13 of the p-type GaAsSb layer 10. Further, the MQB structure 15 provided in the n-type InGaAs layer 11 may be configured by providing a plurality of n-type InP layers 17 on the n-type InGaAs layer 11. In other words, the MQB structure 15 provided in the n-type InGaAs layer 11 may be configured by providing a plurality of n-type InP layers 17 on the n-type InGaAs layer 11.

Figure 26:
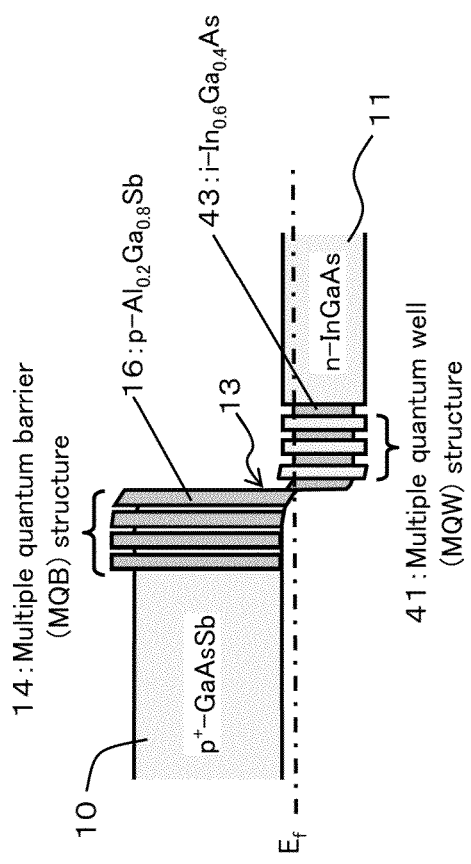
FIG. 26 is a schematic view illustrating an energy band structure of a semiconductor device (backward diode) of a still further modification to the first embodiment and depicting a balanced state in which a voltage is not applied.
Figure 27:
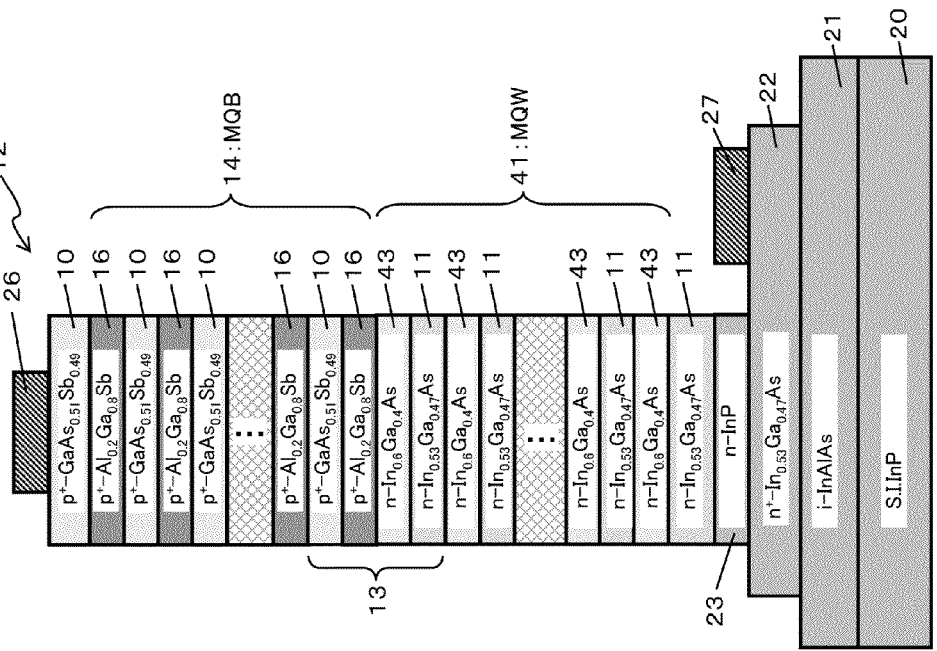
FIG. 27 is a schematic sectional view illustrating a configuration of the semiconductor device (backward diode) of the still further modification to the first embodiment.

Or, the MQB structure 14 may be provided in the p-type GaAsSb layer 10 while the MQW structure 41 is provided in the n-type InGaAs layer 11, for example, as depicted in FIG. 26. In this instance, the MQB structure 14 provided in the p-type GaAsSb layer 10 may be configured by providing a plurality of p-type AlGaSb layer 16 on the p-type GaAsSb layer 10 as depicted in FIG. 27. In other words, the MQB structure 14 may be configured by alternately stacking the p-type GaAsSb layers 10 and the p-type AlGaSb layers 16 in the proximity of the pn junction portion 13 of the p-type GaAsSb layer 10. Further, the MQW structure 41 provided in the n-type InGaAs layer 11 may be configured by providing a plurality of n-type InGaAs layers 43 on the n-type InGaAs layer 11. In other words, the MQW structure 41 provided in the n-type InGaAs layer 11 may be configured by providing a plurality of n-type InGaAs layers 43 on the n-type InGaAs layer 11.

In short, the present semiconductor device may be configured such that it includes a p-type semiconductor layer 10, an n-type semiconductor layer 11, a pn junction portion 13 at which the p-type semiconductor layer 10 and the n-type semiconductor layer 11 are joined to each other, and an MQB structure 14 (15) or an MQW structure 40 (41) that is provided in at least one of the p-type semiconductor layer 10 and the n-type semiconductor layer 11 and functions as a barrier against at least one of electrons and holes upon biasing in a forward direction, wherein, upon biasing in a reverse direction, a portion that allows band-to-band tunneling of electrons is formed at the pn junction portion 13.

Figure 28:
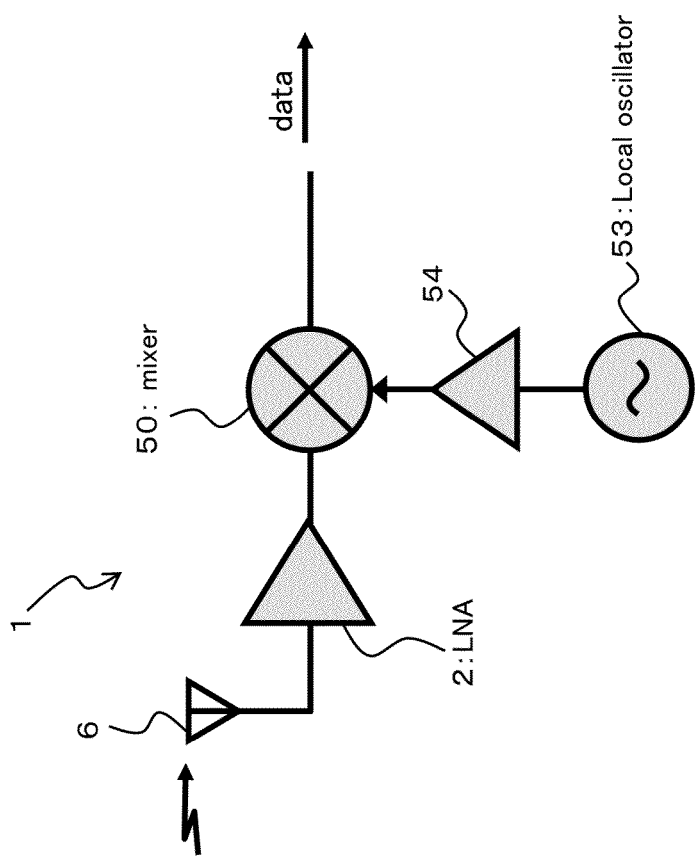
FIG. 28 is a schematic view illustrating a configuration of a receiver of a modification to the first embodiment.
Figure 29:
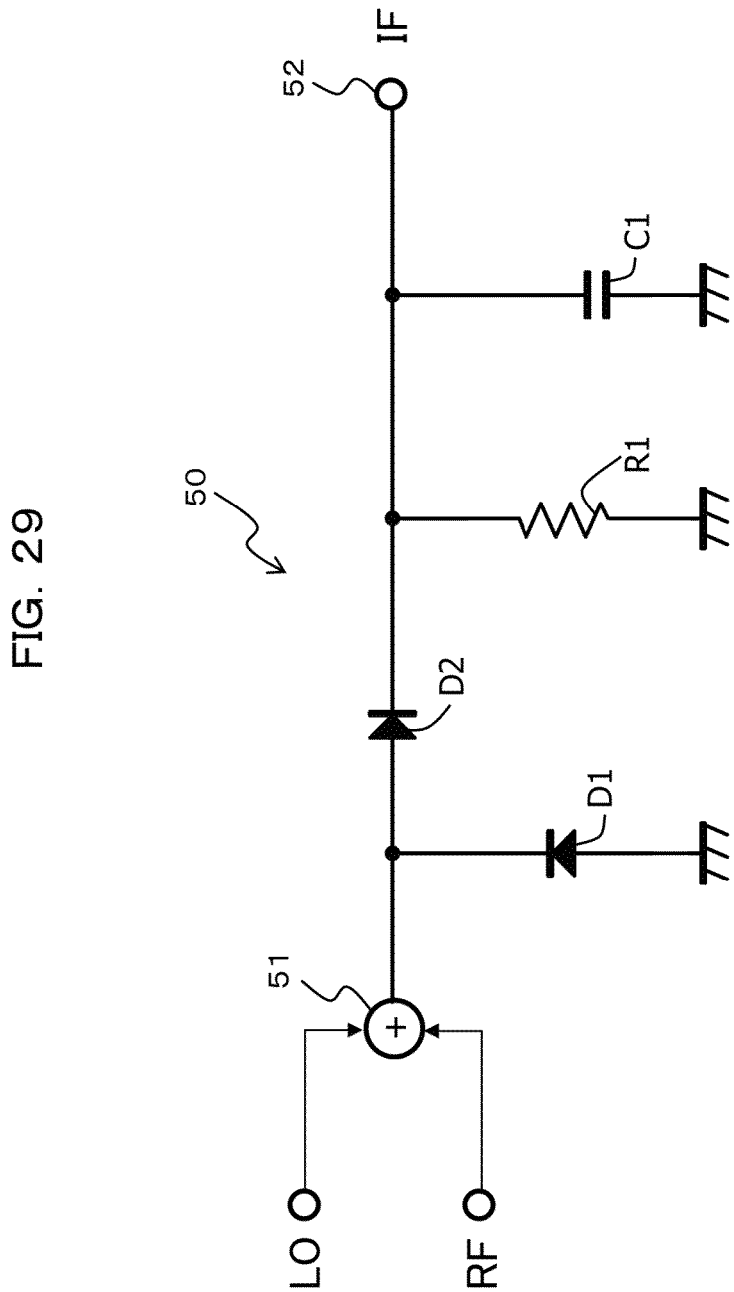
FIG. 29 is a schematic view illustrating a configuration of a mixer circuit provided in the receiver of the modification to the first embodiment.

Further, while, in the embodiment described above, the backward diode 12 in the embodiment described hereinabove is used as the detector 3 provided in the receiver 1, the application of the backward diode 12 is not limited to this. For example, it is possible to use the backward diode 12 in the embodiment described hereinabove in a mixer (mixer circuit) 50 provided in the receiver 1 as illustrated in FIGS. 28 and 29. In particular, the mixer 50 of the receiver 1 may include the semiconductor device of the embodiment described hereinabove. For example, in the mixer 50 that includes a first diode D1, a second diode D2, a resistor R1 and a capacitor C1 and outputs, when an RF signal and an LO signal are inputted to an input terminal 51 thereof, a difference frequency between the signals is outputted as an intermediate frequency (IF) from an output terminal 52, the backward diode 12 in the embodiment described hereinabove can be used as the first diode D1 and the second diode D2. Consequently, the conversion loss can be reduced. In other words, the mixer 50 can be implemented with reduced loss. In this instance, the receiver 1 includes, as depicted in FIG. 28, for example, an antenna 6, a low-noise amplifier 2, a local oscillator 53, an amplifier 54 and so forth in addition to the mixer 50.

Second Embodiment

Now, a semiconductor device according to a second embodiment is described with reference to FIGS. 30 to 33C.

Figure 30:
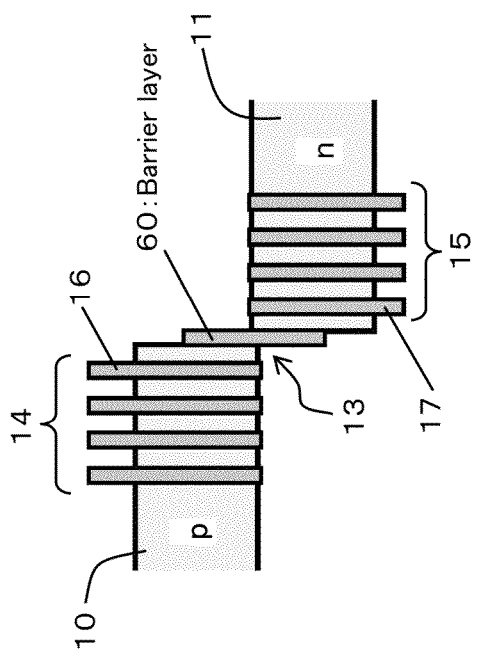
FIG. 30 is a schematic view illustrating an energy band structure in a flat band state in a semiconductor device (backward diode) of a second embodiment.
Figure 31:
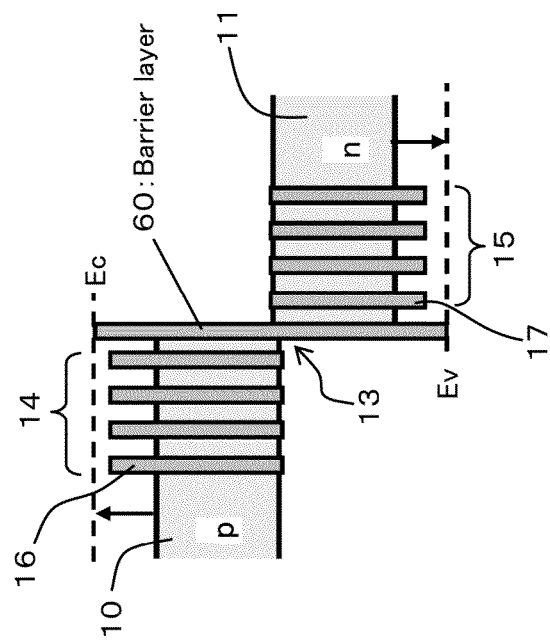
FIG. 31 is a schematic view illustrating an energy band structure in a flat band state in a semiconductor device (backward diode) of a modification to the second embodiment.

The semiconductor device according to the present embodiment is different from that of the first embodiment (refer to FIGS. 1A to 1C and 5) described hereinabove in that it includes a barrier layer 60 provided between the p-type semiconductor layer 10 and the n-type semiconductor layer 11 as depicted in FIG. 30.

In particular, the present semiconductor device includes a backward diode wherein a p-type semiconductor layer (p-type GaAsSb layer) 10 and an n-type semiconductor layer (n-type InGaAs layer) 11 are joined to each other in such a manner as to sandwich the barrier layer 60 therebetween. In other words, the present semiconductor device includes a pn junction portion 13 at which the p-type semiconductor layer 10 and the n-type semiconductor layer 11 are joined to each other in such a manner as to sandwich the barrier layer 60 therebetween.

In this instance, if the MQB structures 14 and 15 are provided similarly as in the case of the first embodiment described hereinabove, then the p-side MQB structure 14 provided in the p-type GaAsSb layer 10 and the n-side MQB structure 15 provided in the n-type InGaAs layer 11 are joined to each other at the pn junction portion 13 in such a manner as to sandwich the barrier layer 60 therebetween. In short, the barrier layer 60 is inserted in the pn junction interface between the p-type MQB structure 14 and the n-side MQB structure 15.

Figure 32:
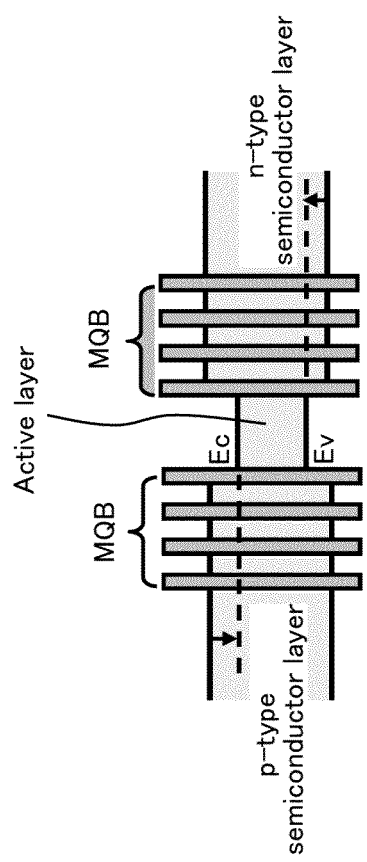
FIG. 32 is a schematic view illustrating an energy band structure in a flat band state where an MQB is provided in a semiconductor laser including an active layer between a p-type semiconductor layer and an n-type semiconductor layer.

Further, a portion that allows band-to-band tunneling of electrons is formed at the pn junction portion 13 upon biasing in the reverse direction at least from the barrier layer 60. In other words, the barrier layer 60 has a thickness which allows band-to-band tunneling of electrodes so that a portion that allows band-to-band tunneling of electrons is formed at the pn junction portion 13 upon biasing in the reverse direction. For example, the thickness of the barrier layer 60 is preferably set to 100 Å or less, namely to 10 nm or less, so that band-to-band tunneling can occur. Since the thickness of the barrier layer 60 is small in this manner, a hetero junction having a type II band structure is formed as a whole, and band-to-band tunneling is likely to occur through the band structure. On the other hand, where the MQB structure is provided in a device which includes an active layer between a p-type semiconductor layer and an n-type semiconductor layer like a semiconductor laser, the device comes to have a type I band structure as depicted in FIG. 32. In this instance, the actively layer has a band gap smaller than that of the p-type semiconductor layer and the n-type semiconductor layer. In other words, since the confining effect of electrons and holes is enhanced, the energy (Ec) at the lower end of the conduction band of the active layer becomes lower than the energy at the lower end of the conduction band of the p-type semiconductor layer and the energy (Ev) at the upper end of the valance band of the active layer becomes higher than the energy at the upper end of the valence band of the n-type semiconductor layer.

It is to be noted that, where a portion that allows band-to-band tunneling is formed at the pn junction portion 13 from the barrier layer 60 and some other layer upon biasing in the reverse direction, the thickness of the barrier layer 60 and the other layer or the like may be adjusted so that the distance of the portion in a horizontal direction may be 100 Å or less, namely, 10 nm or less.

Here, the barrier layer 60 may have, at the lower end of the conduction band thereof, energy between the energy at the lower end of the conduction band of the p-type semiconductor layer 10 and the energy at the lower end of the conduction band of the n-type semiconductor layer 11 and have, at the upper end of the valance band thereof, energy between the energy at the upper end of the valence band of the p-type semiconductor layer 10 and the energy at the upper end of the valence band of the n-type semiconductor layer 11.

It is to be noted that the band gap of the barrier layer 60 may be greater or smaller. However, the barrier layer 60 preferably has a greater band gap. For example, the barrier layer 60 preferably has such a great band gap that it has, at the lower end (Ec) of the conduction band thereof, energy higher than that at the lower end of the conduction band of the p-type semiconductor layer 10 and has, at the upper end of the valance band thereof, energy lower than that at the upper end of the valance band of the n-type semiconductor layer 11. This is called barrier layer of a wide band gap. It is to be noted that only one of the two conditions described above may be satisfied. In particular, the barrier layer 60 may have a band gap increased such that it has, at the lower end of the conduction band thereof, energy higher than that at the lower end of the conduction band of the p-side barrier layer 16 that configures the p-side MQB structure 14 provided in the p-type semiconductor layer 10. Or, the barrier layer 60 may have a band gap increased such that it has, at the upper end of the valence band thereof, energy lower than that at the upper end of the valence band of the n-side barrier layer 17 that configures the n-side MQB structure 15 provided in the n-type semiconductor layer 11.

Figure 33A:
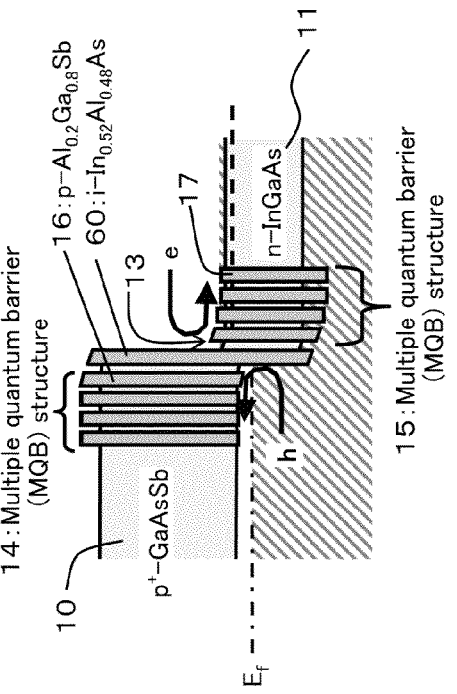
Figure 33B:
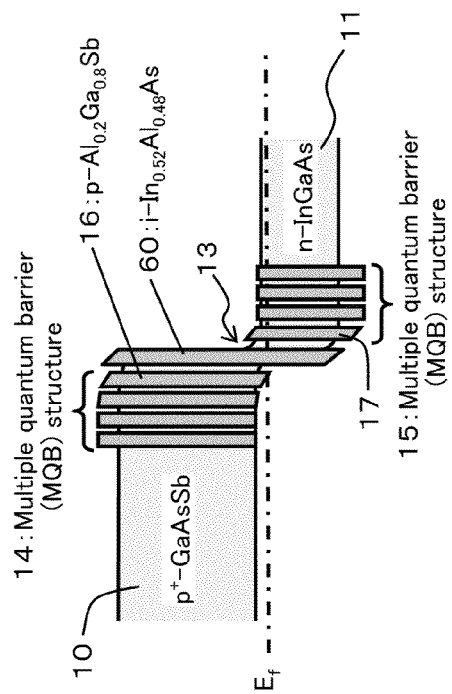
Figure 33C:
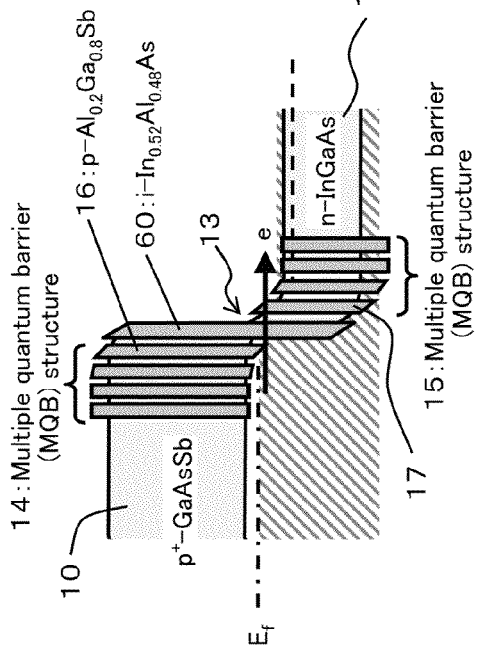

In the present embodiment, the barrier layer 60 is a non-doped InAlAs layer as depicted in FIGS. 33A to 33C. In particular, the barrier layer 60 is an i-$In_{0.52}Al_{0.48}As$ layer having a thickness of approximately 5 nm. In this instance, the barrier layer 60 is a barrier layer of a wide band gap that has, at the lower end of the conduction band thereof, energy higher than that at the lower end of the conduction band of the p-type semiconductor layer 10 and has, at the upper end of the valence band thereof, energy lower than that at the upper end of the valence band of the n-type semiconductor layer 11. Therefore, the barrier layer 60 functions as a barrier that prevents re-coupling of electrons and holes. In other words, the barrier layer 60 functions, upon biasing in the forward direction, as a barrier for electrons in the conduction band and holes in the valence band and functions as a barrier which suppresses leakage current. Further, since the barrier layer 60 is a non-doped layer, it functions also as a barrier that suppresses diffusion of impurities from the semiconductor layer 10 that is doped in the p type on the p side or from the semiconductor layer 11 that is doped in the n type on the n side.

It is to be noted that, while an i-$In_{0.52}Al_{0.48}As$ layer is used as the barrier layer 60 in the present embodiment, the barrier layer 60 is not limited to this.

Further, while the barrier layer 60 here is a non-doped layer, the barrier layer 60 is not limited to this but may be doped in the n type or the p type. For example, p-type InAlGaAs, p-type $In_xGa_{1-x}As$, p-type AlSb, n-type InAlGaAs, n-type $In_xAl_{1-x}As$ or the like may be used for the barrier layer 60. In this instance, the doping concentration may be $5\times10^{18}$ $cm^{-3}$.

In this manner, non-doped InAlGaAs, non-doped $In_xAl_{1-x}As$, non-doped AlSb, p-type InAlGaAs, p-type $In_xAl_{1-x}As$, p-type AlSb, n-type InAlGaAs, n-type $In_xAl_{1-x}As$ and so forth can be used for the barrier layer 60. In other words, the barrier layer may include one selected from the group consisting of non-doped InAlGaAs, non-doped InAlAs, non-doped AlAs, non-doped AlSb, p-type InAlGaAs, p-type InAlAs, p-type AlAs, p-type AlSb, n-type InAlGaAs, n-type InAlAs, n-type AlAs and n-type AlSb.

It is to be noted that details of the other part are similar to those of the first embodiment described hereinabove, and therefore, overlapping description of the same is omitted herein.

Accordingly, with the semiconductor device according to the present embodiment, there is an advantage that leakage current upon biasing in the forward direction of the backward diode 12 can be suppressed. Further, there is another advantage that the detection characteristic of the detector 3 which uses the backward diode 12 and hence the characteristic of the receiver 1 can be improved.

It is to be noted that, while, in the embodiment described above, the semiconductor device that includes the barrier layer 60 in addition to the components of the first embodiment (refer to FIGS. 1A to 1C and 5) described hereinabove is taken as an example, the semiconductor device of the second embodiment is not limited to this, but the barrier layer 60 in the present embodiment may be additionally provided in the modifications (FIGS. 14A to 14C, 18A to 18C, 22A, 22B, 24 and 26) to the first embodiment described hereinabove. In short, the barrier layer 60 in the present embodiment can be applied to the semiconductor devices of the first embodiment and the modifications to the first embodiment.

Figure 35A:
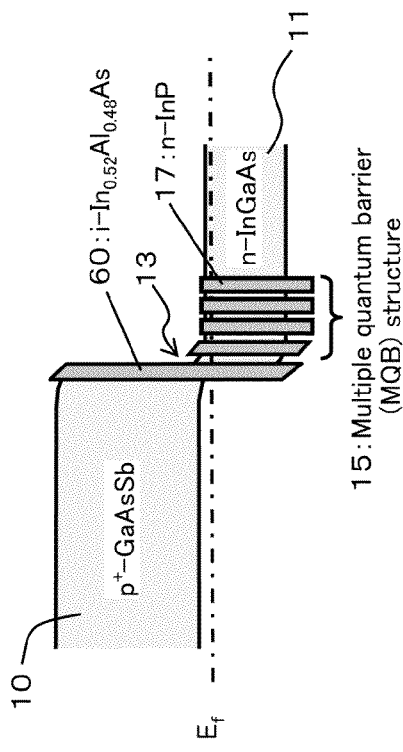
Figure 35C:
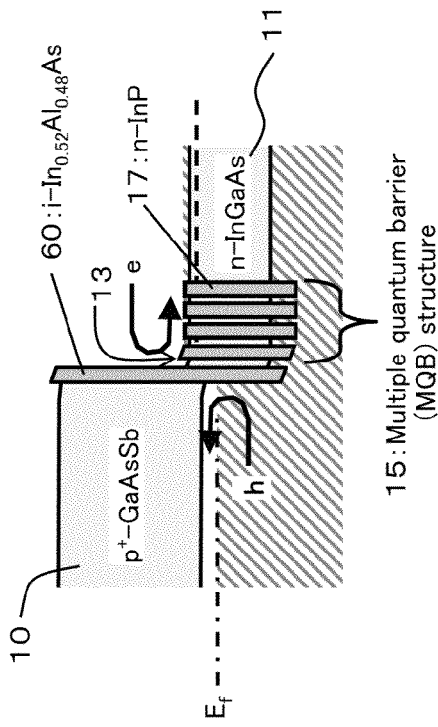
Figure 35B:
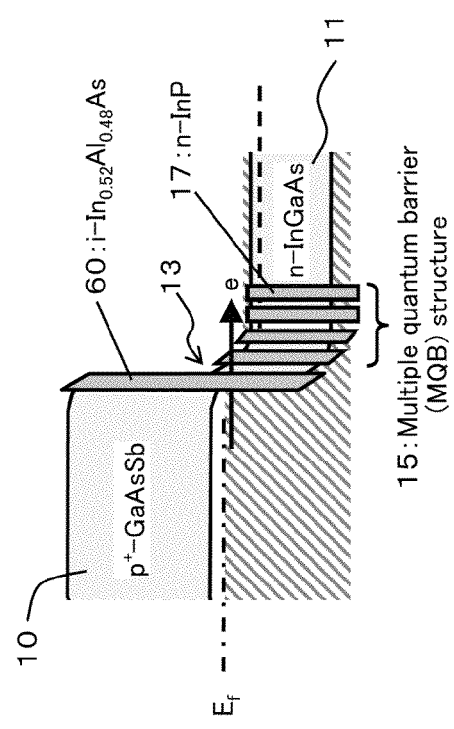
Figure 37A:
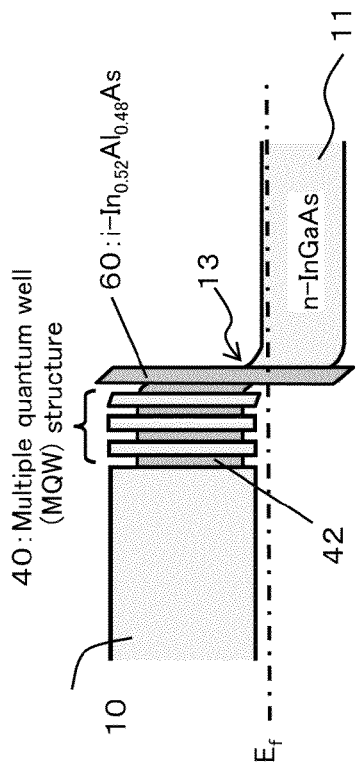
Figure 37C:
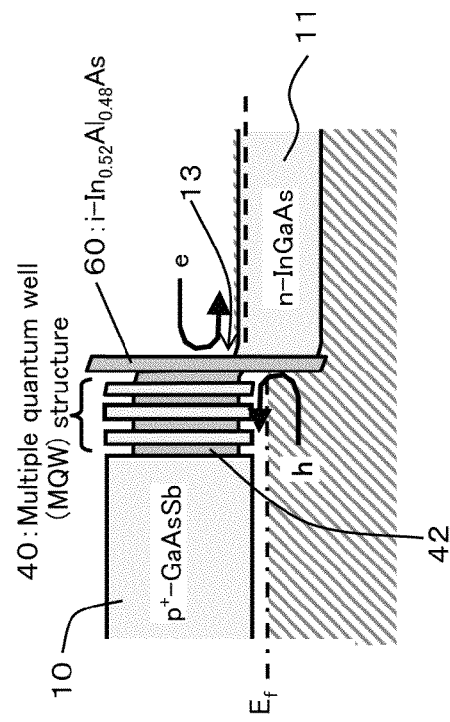
Figure 37B:
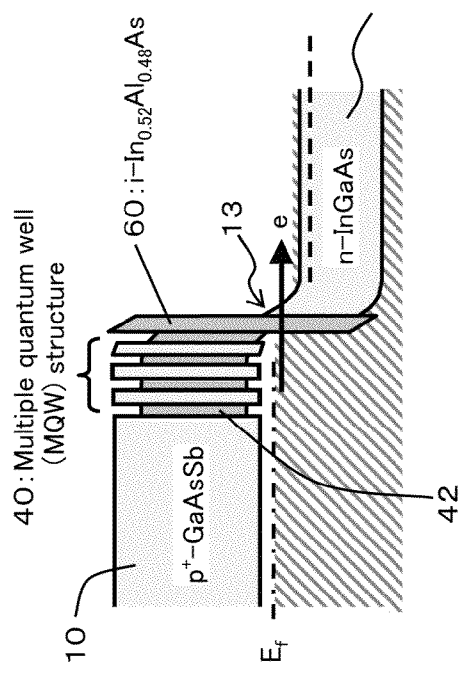
Figure 38A:
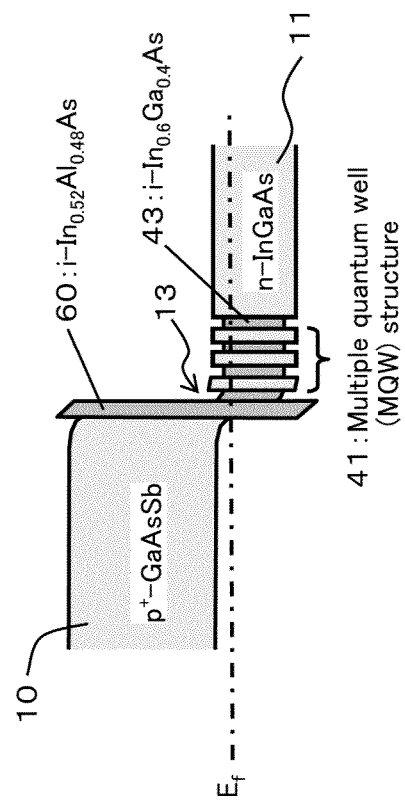
Figure 38C:
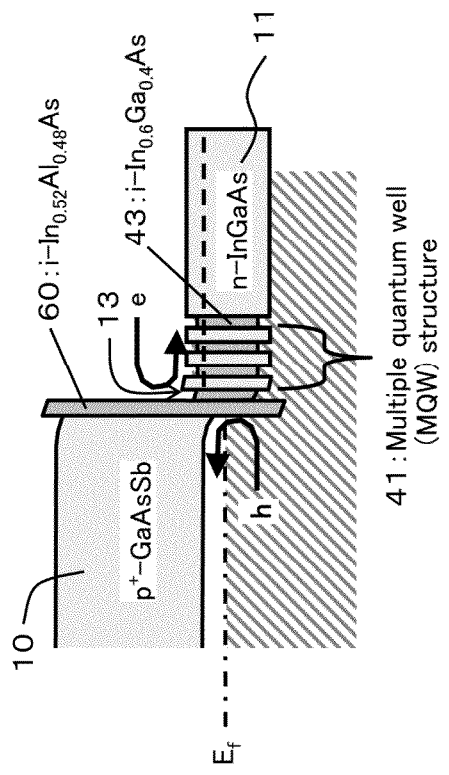
Figure 38B:
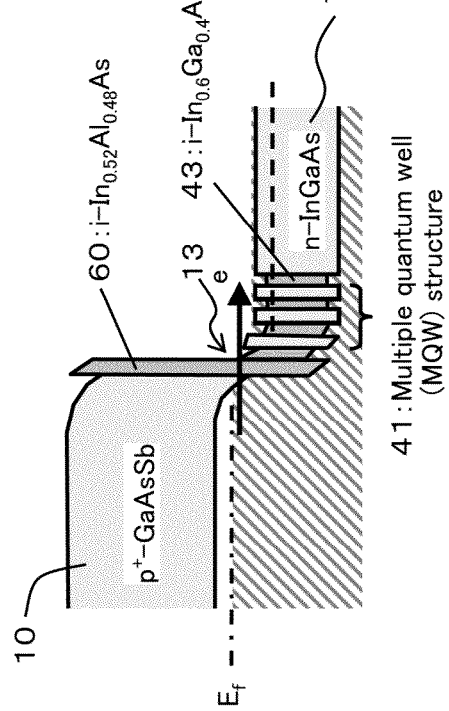

For example, the barrier layer 60 in the present embodiment may be additionally provided in a semiconductor device wherein the MQB structure 14 is provided only in the p-type GaAsSb layer 10 as depicted in FIGS. 34A to 34C. Or, for example, the barrier layer 60 in the present embodiment may be additionally provided in a semiconductor device wherein the MQB structure 15 is provided only in the n-type InGaAs layer 11 as depicted in FIGS. 35A to 35C. Further, for example, the barrier layer 60 in the present embodiment may be additionally provided in a semiconductor device wherein the MQW structure 40 is provided in the p-type GaAsSb layer 10 and the MQW structure 41 is provided in the n-type InGaAs layer 11 as depicted in FIGS. 36A to 36C. Furthermore, for example, the barrier layer 60 in the present embodiment may be additionally provided in a semiconductor device wherein the MQW structure 40 is provided only in the p-type GaAsSb layer 10 as depicted in FIGS. 37A to 37C. Further, for example, the barrier layer 60 in the present embodiment may be provided in a semiconductor device wherein the MQW structure 41 is provided only in the n-type InGaAs layer 11 as depicted in FIGS. 38A to 38C.

[Others]

It is to be noted that the present invention is not limited to the configurations described in the foregoing description of the embodiments and the modifications but they can be modified in various manners without departing from the subject matter of the present invention.

For example, while, in the embodiments and the modifications described above, the p-type semiconductor layer 10 and the n-type semiconductor layer 11 are made of different materials, the materials are not limited to them. For example, the p-type semiconductor layer 10 and the n-type semiconductor layer 11 may be configured from the same material. In particular, the p-type semiconductor layer 10 and the n-type semiconductor layer 11 may be configured such that they are made of the same material but have different compositions such that they have different conduction types by using different impurities to be doped therein.

Figure 39:
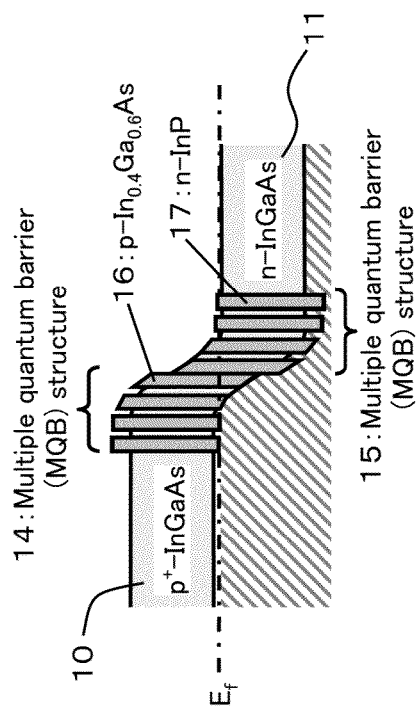
FIG. 39 is a schematic view illustrating an energy band structure of a semiconductor device (backward diode) of a modification to the first and second embodiments and depicting a balanced state in which a voltage is not applied.

For example, the p-type semiconductor layer 10 and the n-type semiconductor layer 11 may be configured such that, as depicted in FIG. 39, they are formed as a layer including InGaAs (for example, as an $In_{0.53}Ga_{0.47}As$ layer) and a plurality of barrier layers 16 that configure the MQB structure 14 provided in the p-type semiconductor layer 10 are formed as layers including InGaAs (for example, as p-type $In_{0.4}Ga_{0.6}As$ layers) that have a band gap greater than that of InGaAs (for example, a p-type $In_{0.53}Ga_{0.47}As$ layer) that is used for the p-type semiconductor layer 10 while a plurality of barrier layers 17 that configure the MQB structure 15 provided in the n-type semiconductor layer 11 are formed as layers including InP (for example, InP layers). It is to be noted here that the barrier layers 16 that configure the MQB structure 14 provided in the p-type semiconductor layer 10 are not limited to them, but may include InGaAs that has a band gap greater than that of InGaAs (for example, n-type $In_{0.53}Ga_{0.47}As$ layers) that is used, for example, for the n-type semiconductor layer 11. Further, while modifications to the first embodiment are described here as examples, the semiconductor devices are not limited to them but can be configured as modifications to the embodiments and the modifications described hereinabove. For example, the MQW structure may be provided in place of the MQB structure. In this instance, a plurality of well layers that configure the MQW structure provided in the p-type semiconductor layer 10 may be formed so as to include InGaAs that have a band gap smaller than that of InGaAs that is used for the p-type semiconductor layer 10. Further, a plurality of well layers that configure the MQW layer provided in the n-type semiconductor layer 11 may be formed so as to include InGaAs that has a band gap smaller than that of InGaAs that is used for the n-type semiconductor layer 11.

All examples and conditional language recited herein are intended for pedagogical purposes to aid the reader in understanding the invention and the concepts contributed by the inventor to further the art, and are not to be construed as limitations to such specifically recited examples and conditions, nor does the organization of such examples in the specification relates to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a p-type semiconductor layer;
   an n-type semiconductor layer;
   a pn junction portion at which the p-type semiconductor layer and the n-type semiconductor layer are joined to each other; and
   a multiple quantum barrier structure or a multiple quantum well structure that is provided in at least one of the p-type semiconductor layer and the n-type semiconductor layer and functions as a barrier against at least one of electrons and holes upon biasing in a forward direction; wherein,
   upon biasing in a reverse direction, a portion that allows band-to-band tunneling of electrons is formed at the pn junction portion,
   the semiconductor device is a backward diode which has a hetero junction of the type II wherein, in a flat band state, the energy at a lower end of the conduction band of the n-type semiconductor layer is lower than that at a lower end of the conduction band of the p-type semiconductor layer and the energy at an upper end of the valence band of the n-type semiconductor layer is lower than that at an upper end of the valence band of the p-type semiconductor layer, and the energy at the lower end of the conduction band of the n-type semiconductor layer is higher than that at the upper end of the valence band of the p-type semiconductor layer.

2. The semiconductor device according to claim 1, wherein the multiple quantum barrier structure or the multiple quantum well structure is provided in the p-type semiconductor layer;
   the p-type semiconductor layer and the n-type semiconductor layer are joined, at the pn junction portion, to each other in such a manner as to sandwich therebetween one barrier layer included in the multiple quantum barrier structure or one well layer included in the multiple quantum well structure; and
   the portion that allows band-to-band tunneling of electros is formed at the pn junction portion upon biasing in the reverse direction from the one barrier layer or the one well layer and the n-type semiconductor layer, or from the multiple quantum barrier structure and the n-type semiconductor layer.

3. The semiconductor device according to claim 2, wherein a plurality of barrier layers that configure the multiple quantum barrier structure or a plurality of well layers that configure the multiple quantum well structure are doped in the p type.

4. The semiconductor device according to claim 1, wherein the multiple quantum barrier structure or the multiple quantum well structure is provided in the n-type semiconductor layer;
   the p-type semiconductor layer and the n-type semiconductor layer are joined, at the pn junction portion, to each other in such a manner as to sandwich therebetween one barrier layer included in the multiple quantum barrier structure or one well layer included in the multiple quantum well structure; and
   the portion that allows band-to-band tunneling of electros is formed at the pn junction portion upon biasing in the reverse direction from the one barrier layer or the one well layer and the p-type semiconductor layer, or from the multiple quantum barrier structure and the p-type semiconductor layer.

5. The semiconductor device according to claim 4, wherein a plurality of barrier layers that configure the multiple quantum barrier structure or a plurality of well layers that configure the multiple quantum well structure are doped in the n type.

6. The semiconductor device according to claim 1, wherein the multiple quantum barrier structure or the multiple quantum well structure is a p-side multiple quantum barrier structure or a p-side multiple quantum well structure provided in the p-type semiconductor layer and an n-side multiple quantum barrier structure or an n-side multiple quantum well structure provided in the n-type semiconductor layer;
   the p-type semiconductor layer and the n-type semiconductor layer are joined, at the pn junction portion, to each other in such a manner as to sandwich therebetween one p-side barrier layer included in the p-side multiple quantum barrier structure or one p-side well layer included in the p-side multiple quantum well structure, and one n-side barrier layer included in the n-side multiple quantum barrier structure or one n-side well layer included in the n-side multiple quantum well structure; and
   the portion that allows band-to-band tunneling of electros is formed at the pn junction portion upon biasing in the reverse direction from the one p-side barrier layer or the one p-side well layer and the one n-side barrier layer or the one n-side well layer, or from the p-side multiple quantum barrier structure or the p-side multiple quantum well structure and the n-side multiple quantum barrier structure or the n-side multiple quantum well structure.

7. The semiconductor device according to claim 6, wherein a plurality of barrier layers that configure the p-side multiple quantum barrier structure or a plurality of well layers that configure the p-side multiple quantum well structure are doped in the p type; and a plurality of barrier layers that configure the n-side multiple quantum barrier structure or a plurality of well layers that configure the n-side multiple quantum well structure are doped in the n type.

8. The semiconductor device according to claim 1, further comprising a barrier layer that is provided between the p-type semiconductor layer and the n-type semiconductor layer, the barrier layer having, at a lower end of a conduction band thereof, energy between energy at a lower end of a conduction band of the p-type semiconductor layer and energy at a lower end of a conduction band of the n-type semiconductor layer, and having, at an upper end of a valence band thereof, energy between energy at an upper end of a valence band of the p-type semiconductor layer and energy at an upper end of a valence band of the n-type semiconductor layer; and wherein
the p-type semiconductor layer and the n-type semiconductor layer are joined to each other at the pn junction portion in such a manner as to sandwich the barrier layer therebetween; and
the portion that allows band-to-band tunneling of electros is formed at the pn junction portion upon biasing in the reverse direction at least from the barrier layer.

9. The semiconductor device according to claim 8, wherein the multiple quantum barrier structure or the multiple quantum well structure is provided in the p-type semiconductor layer.

10. The semiconductor device according to claim 8, wherein the multiple quantum barrier structure or the multiple quantum well structure is provided in the n-type semiconductor layer.

11. The semiconductor device according to claim 8, wherein the multiple quantum barrier structure or the multiple quantum well structure is a p-side multiple quantum barrier structure or a p-side multiple quantum well structure provided in the p-type semiconductor layer, and an n-side multiple quantum barrier structure or an n-side multiple quantum well structure provided in the n-type semiconductor layer.

12. The semiconductor device according to claim 8, wherein the barrier layer includes one selected from the group consisting of non-doped InAlGaAs, non-doped InAlAs, non-doped AlAs, non-doped AlSb, p-type InAlGaAs, p-type InAlAs, p-type AlAs, p-type AlSb, n-type InAlGaAs, n-type InAlAs, n-type AlAs and n-type AlSb.

13. The semiconductor device according to claim 1, wherein the p-type semiconductor layer and the n-type semiconductor layer are formed from materials different from each other.

14. The semiconductor device according to claim 1, wherein the p-type semiconductor layer contains GaAsSb;
the n-type semiconductor layer includes InGaAs;
where the multiple quantum barrier structure is provided in the p-type semiconductor layer, the barrier layers that configure the multiple quantum barrier structure include AlGaSb or AlAsSb; and
where the multiple quantum well structure is provided in the p-type semiconductor layer, the well layers that configure the multiple quantum well structure include GaSb, AlGaSb, InGaSb, InAsSb or InGaAsSb.

15. The semiconductor device according to claim 1, wherein the p-type semiconductor layer includes GaAsSb;
the n-type semiconductor layer includes InGaAs;
where the multiple quantum barrier structure is provided in the n-type semiconductor layer, the barrier layers that configure the multiple quantum barrier structure include InP, InGaAs, InAlAs or InAlGaAs; and where the multiple quantum well structure is provided in the n-type semiconductor layer, the well layers that configure the multiple quantum well structure include InGaAs, InAlGaAs or InAsSb that has a band gap smaller than that of InGaAs used for the n-type semiconductor layer.

16. The semiconductor device according to claim 1, wherein the p-type semiconductor layer and the n-type semiconductor layer are configured from the same material.

17. The semiconductor device according to claim 1, wherein the p-type semiconductor layer and the n-type semiconductor layer include InGaAs;
where the multiple quantum barrier structure is provided in the p-type semiconductor layer, the barrier layers that configure the multiple quantum barrier structure include InP or include InGaAs that has a band gap greater than that of InGaAs used for the p-type semiconductor layer; and
where the multiple quantum well structure is provided in the p-type semiconductor layer, the plural well layers that configure the multiple quantum well structure include InGaAs that has a band gap smaller than that of InGaAs used for the p-type semiconductor layer.

18. The semiconductor device according to claim 1, wherein the p-type semiconductor layer and the n-type semiconductor layer include InGaAs;
where the multiple quantum barrier structure is provided in the n-type semiconductor layer, the barrier layers that configure the multiple quantum barrier structure include InP or include InGaAs that has a band gap greater than that of InGaAs used for the n-type semiconductor layer; and
where the multiple quantum well structure is provided in the n-type semiconductor layer, the well layers that configure the multiple quantum well structure include InGaAs that has a band gap smaller than that of InGaAs used for the n-type semiconductor layer.

19. A receiver, comprising:
an amplifier; and
a detector connected to the amplifier; wherein
the detector is a semiconductor device including:
a p-type semiconductor layer;
an n-type semiconductor layer;
a pn junction portion at which the p-type semiconductor layer and the n-type semiconductor layer are joined to each other; and
a multiple quantum barrier structure or a multiple quantum well structure that is provided in at least one of the p-type semiconductor layer and the n-type semiconductor layer and functions as a barrier against at least one of electrons and holes upon biasing in a forward direction; wherein,
upon biasing in a reverse direction, a portion that allows band-to-band tunneling of electrons is formed at the pn junction portion,
the semiconductor device is a backward diode which has a hetero junction of the type II wherein, in a flat band state, the energy at a lower end of the conduction band of the n-type semiconductor layer is lower than that at a lower end of the conduction band of the p-type semiconductor layer and the energy at an upper end of the valence band of the n-type semiconductor layer is lower than that at an upper end of the valence band of the p-type semiconductor layer, and the energy at the lower end of the conduction band of the n-type semiconductor layer is higher than that at the upper end of the valence band of the p-type semiconductor layer.

20. A receiver, comprising:
a mixer circuit; wherein
the mixer circuit includes a semiconductor device including:
- a p-type semiconductor layer;
- an n-type semiconductor layer;
- a pn junction portion at which the p-type semiconductor layer and the n-type semiconductor layer are joined to each other; and
- a multiple quantum barrier structure or a multiple quantum well structure that is provided in at least one of the p-type semiconductor layer and the n-type semiconductor layer and functions as a barrier against at least one of electrons and holes upon biasing in a forward direction; wherein, upon biasing in a reverse direction, a portion that allows band-to-band tunneling of electrons is formed at the pn junction portion, the semiconductor device is a backward diode which has a hetero junction of the type II wherein, in a flat band state, the energy at a lower end of the conduction band of the n-type semiconductor layer is lower than that at a lower end of the conduction band of the p-type semiconductor layer and the energy at an upper end of the valence band of the n-type semiconductor layer is lower than that at an upper end of the valence band of the p-type semiconductor layer, and the energy at the lower end of the conduction band of the n-type semiconductor layer is higher than that at the upper end of the valence band of the p-type semiconductor layer.

* * * * *